US006646975B1

(12) United States Patent
Uchizaki et al.

(10) Patent No.: US 6,646,975 B1
(45) Date of Patent: Nov. 11, 2003

(54) SEMICONDUCTOR LASER ARRAY AND ITS MANUFACTURING METHOD, OPTICAL INTEGRATED UNIT AND OPTICAL PICKUP

(75) Inventors: Ichiro Uchizaki, Fujisawa (JP); Kazushige Mori, Yokohama (JP); Hideo Shiozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/340,349

(22) Filed: Jun. 25, 1999

(30) Foreign Application Priority Data

Jun. 26, 1998 (JP) .......................... 10-181068

(51) Int. Cl.[7] .................. G11B 7/125; G11B 7/135
(52) U.S. Cl. ............ 369/121; 369/44.12; 369/112.15; 369/120
(58) Field of Search ................. 369/44.12, 44.37, 369/112.04, 112.07, 112.09–112.1, 112.12, 112.14–112.15, 120–122

(56) References Cited

U.S. PATENT DOCUMENTS 5,157,680 A    10/1992  Goto
5,696,749 A  * 12/1997  Brazas et al. .......... 369/112.09
6,084,845 A  *  7/2000  Mizuno ................ 369/44.37 X
6,298,028 B1 * 10/2001  Arikawa et al. ..... 369/44.37 X

FOREIGN PATENT DOCUMENTS

JP         01 272177        10/1989

* cited by examiner

Primary Examiner—W. R. Young
(74) Attorney, Agent, or Firm—Hogan & Hartson, LLP

(57) ABSTRACT

A semiconductor laser array including a plurality of index-guided semiconductor lasers different in oscillation wavelength is made by collectively controlling their double transverse modes and collectively processing them to form their current-blocking structures and buried layers. Thus, a semiconductor laser having a flat element surface and excellent in heat radiation can be made in a reduced number of manufacturing steps. When the laser array of this multi-wavelength type and a detector PD are mounted with a predetermined positional relationship, return light from an optical disk can be converted into a single point to enable detection thereof at PD on one chip. Therefore, an optical disk driving apparatus remarkably reduced in size and weight and having a high reliability can be realized.

14 Claims, 20 Drawing Sheets

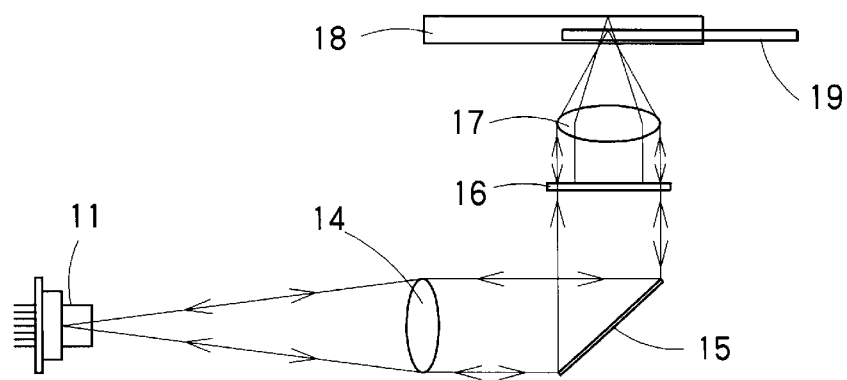
F I G. 1
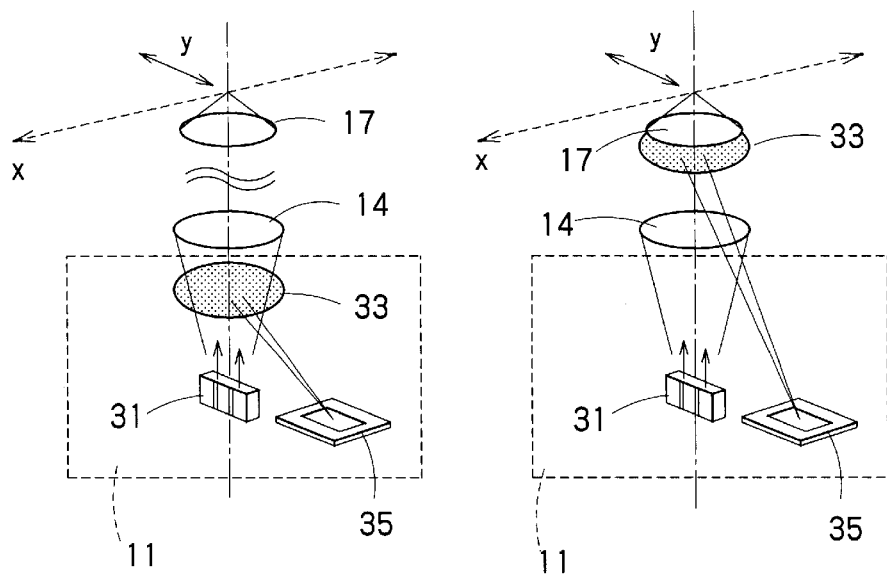
F I G. 2A    F I G. 2B

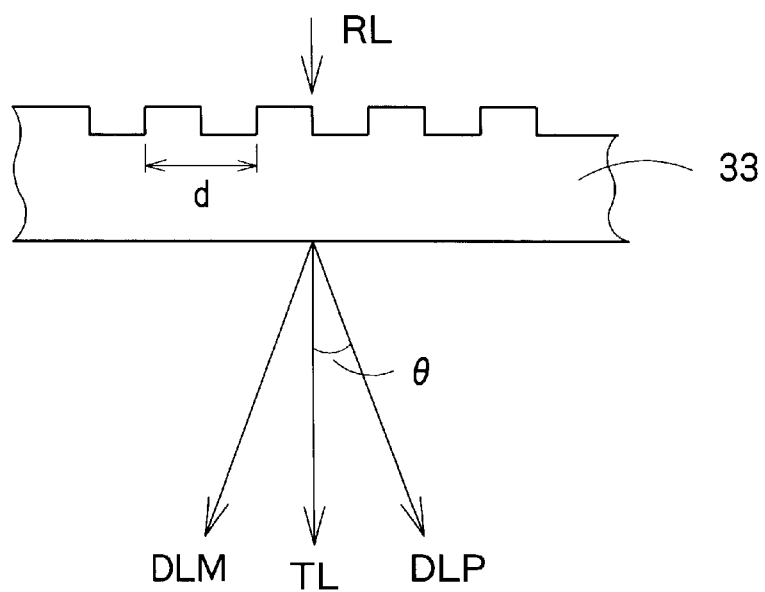
F I G. 3A
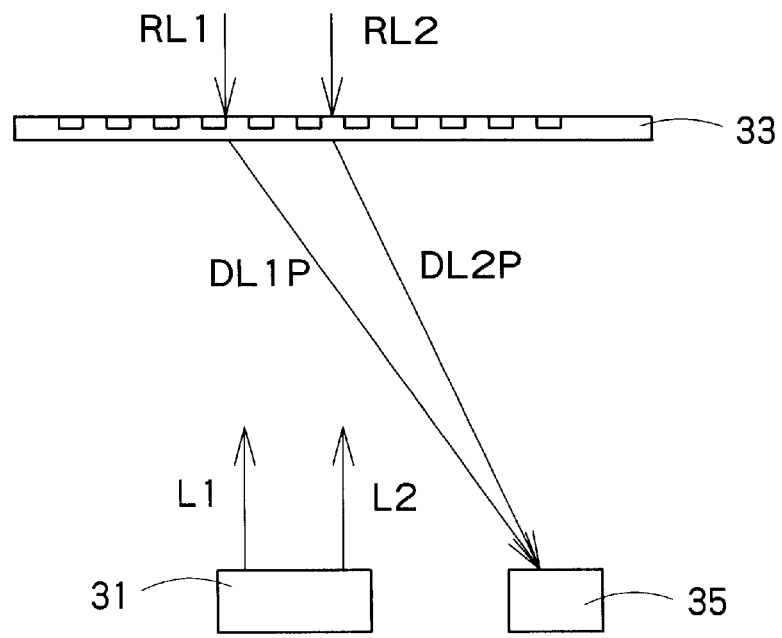
F I G. 3B

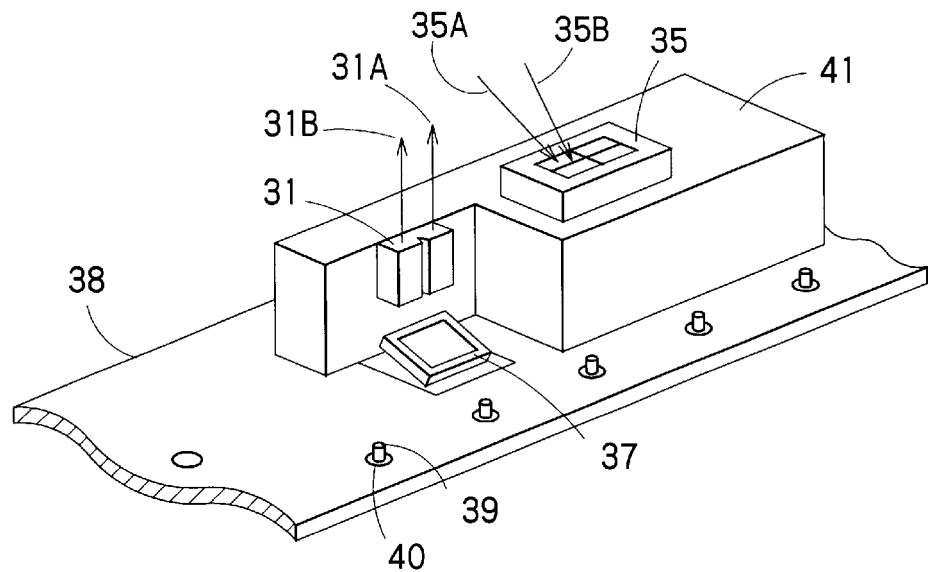
F I G. 5
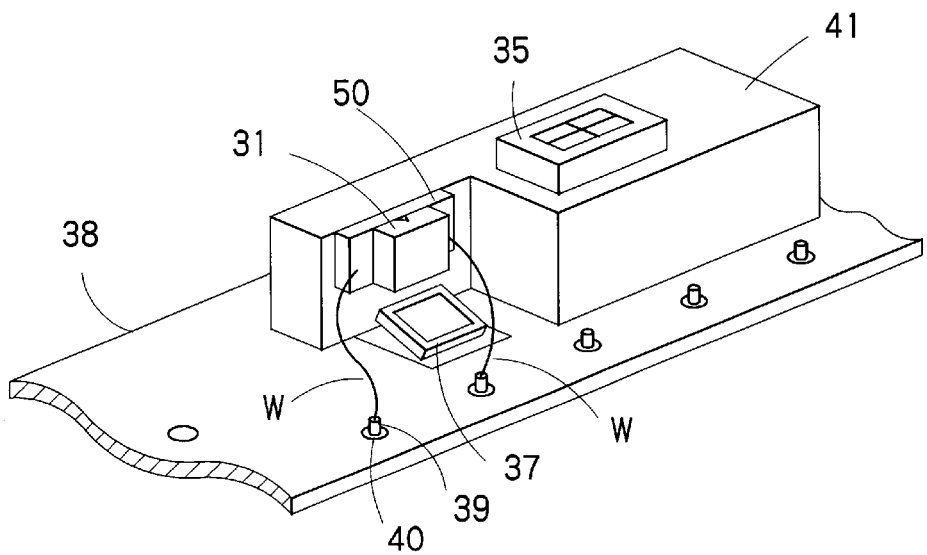
F I G. 6

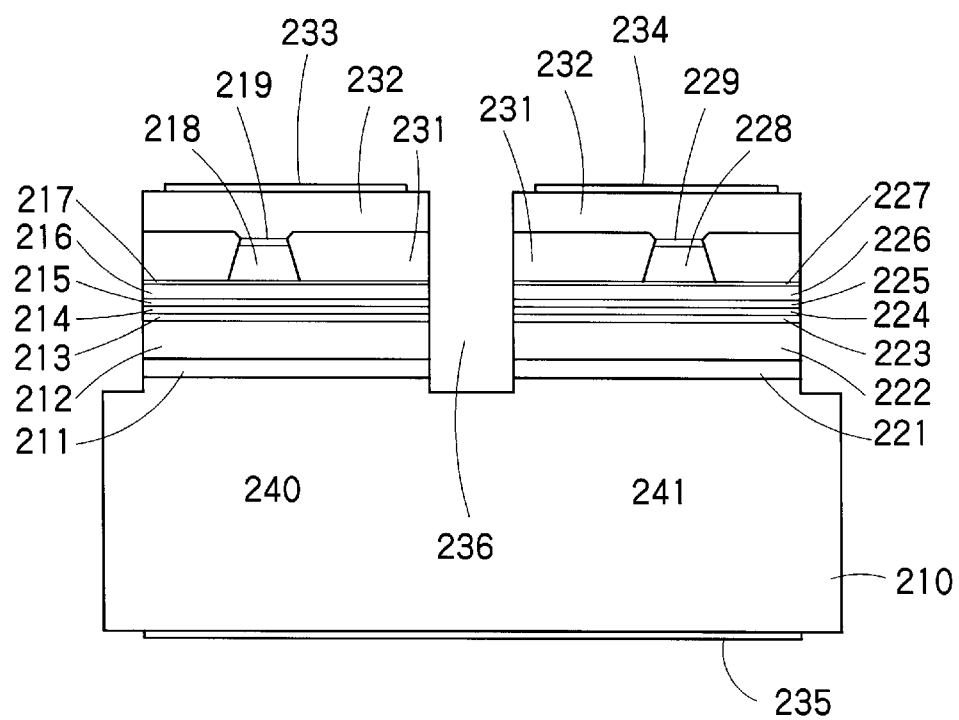
F I G. 9

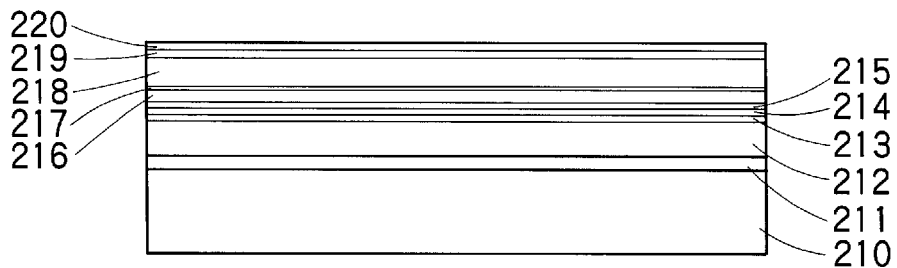
F I G. 10
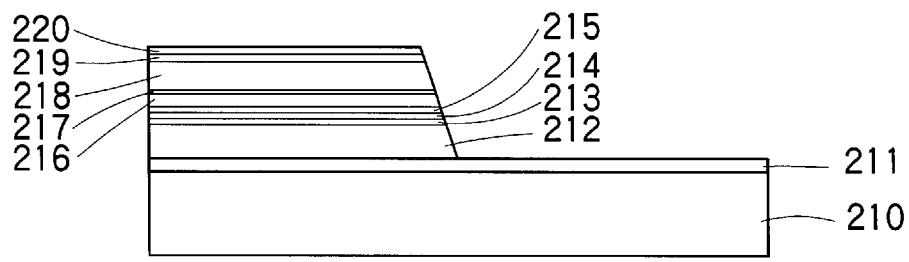
F I G. 11
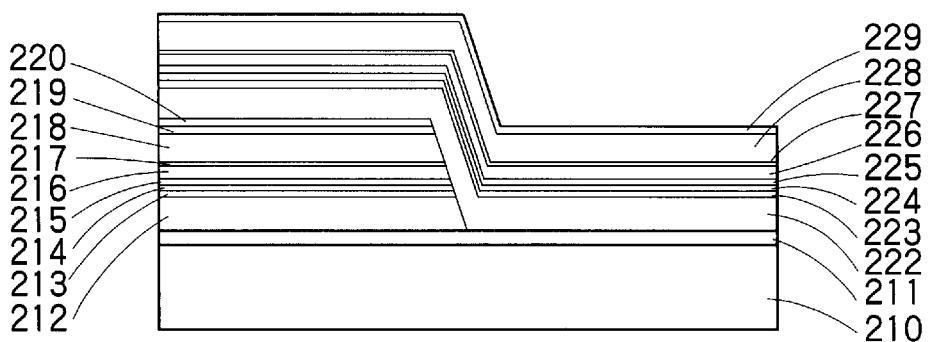
F I G. 12

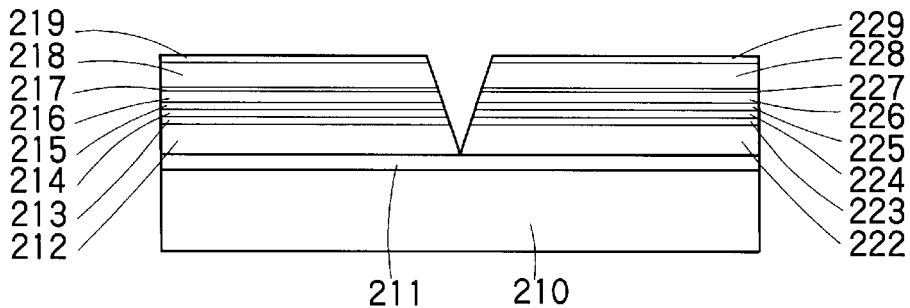
F I G. 13
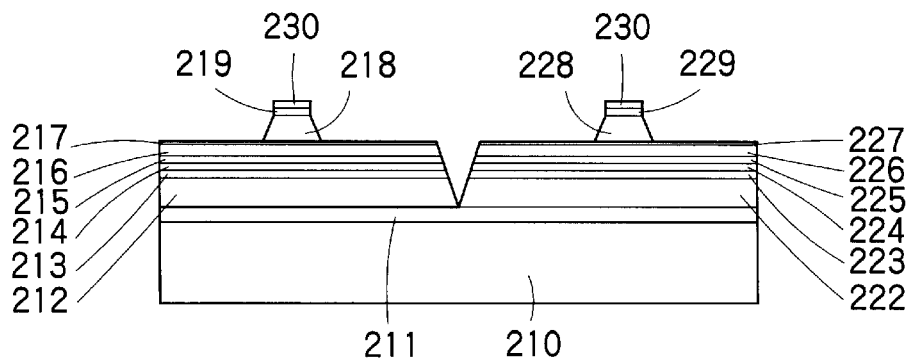
F I G. 14
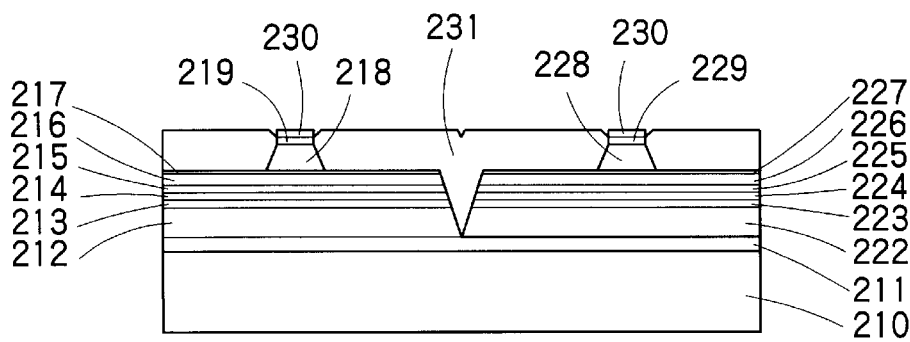
F I G. 15

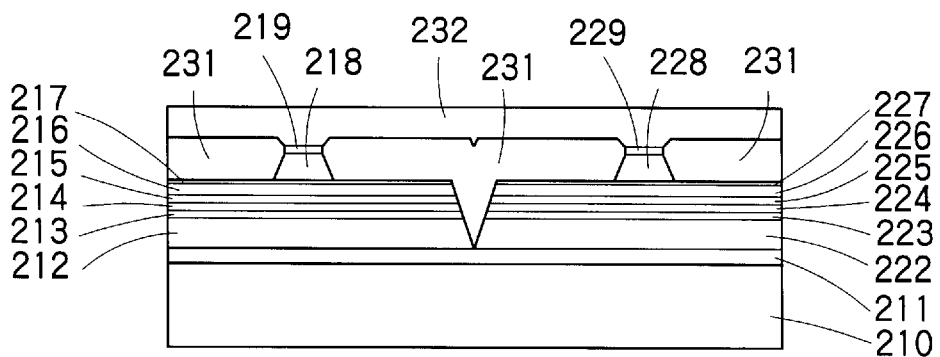
F I G. 16
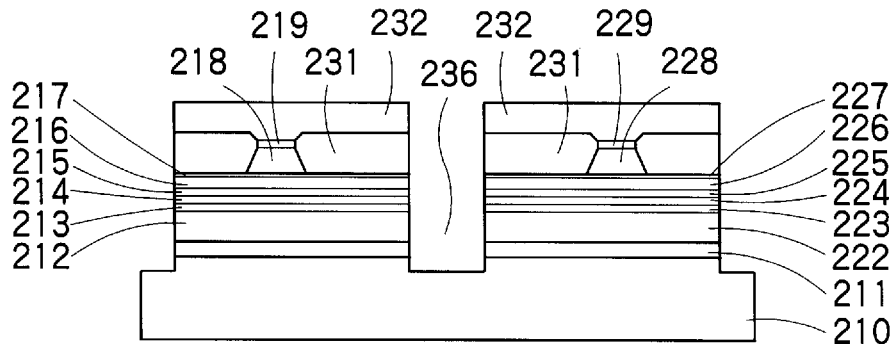
F I G. 17
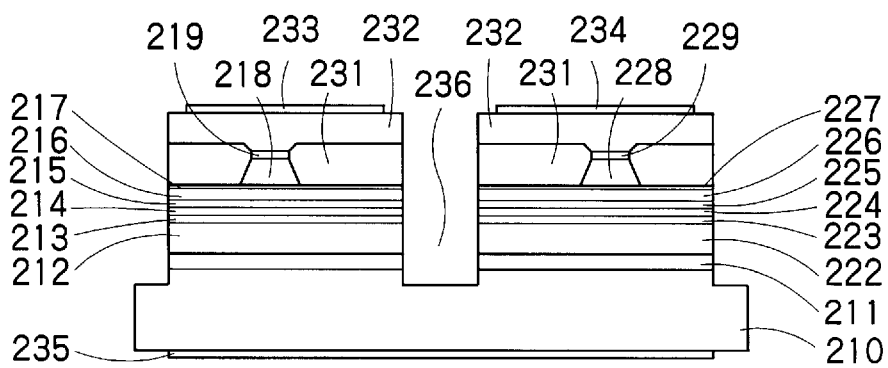
F I G. 18

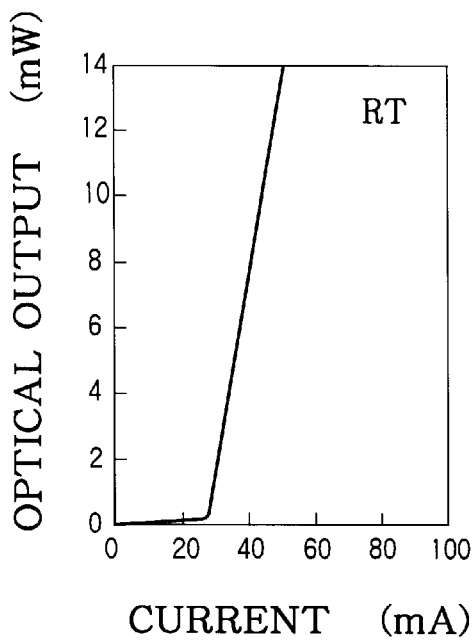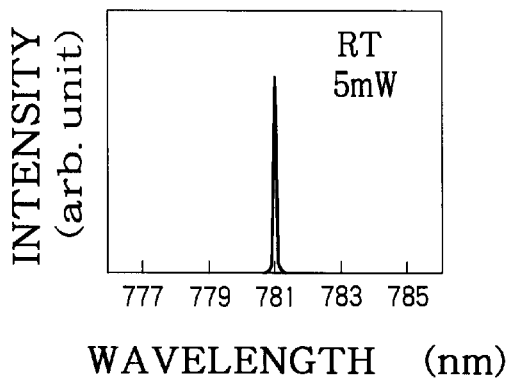
FIG. 20A
FIG. 20B
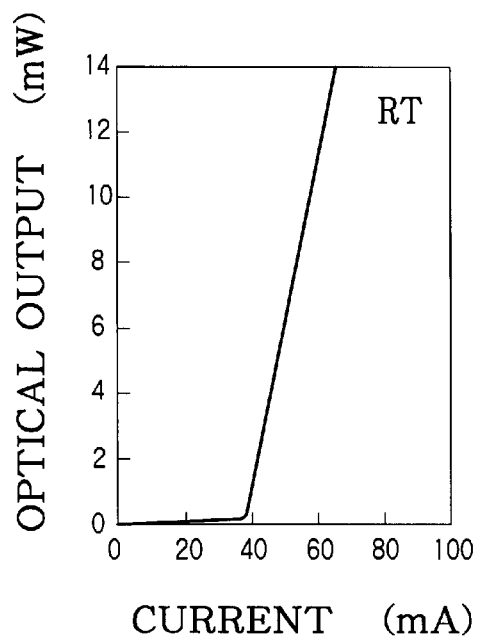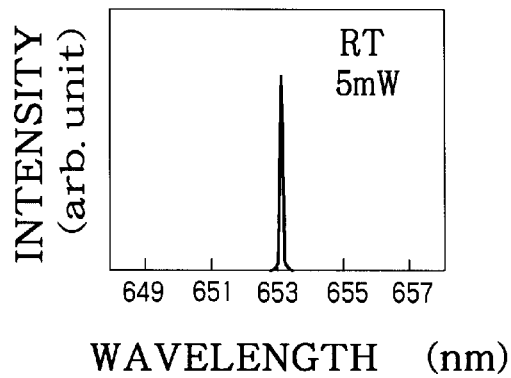
FIG. 21A
FIG. 21B

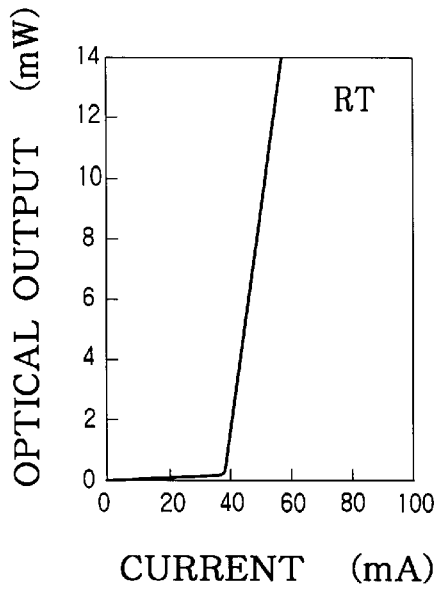
F I G. 22A
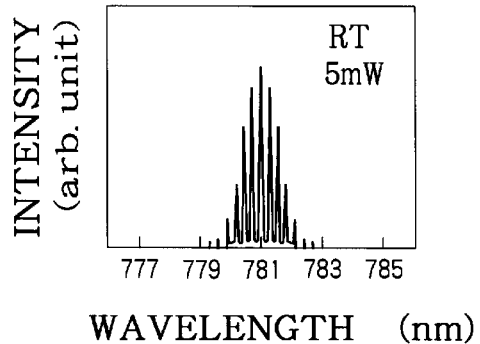
F I G. 22B
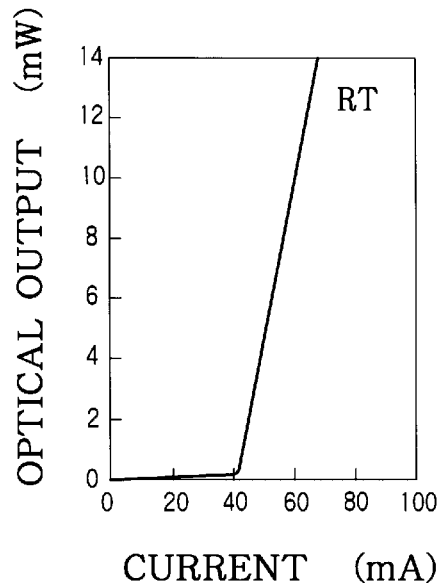
F I G. 23A
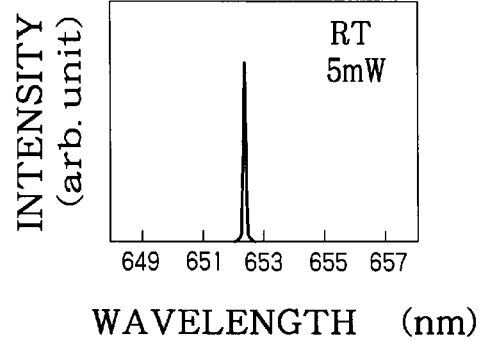
F I G. 23B

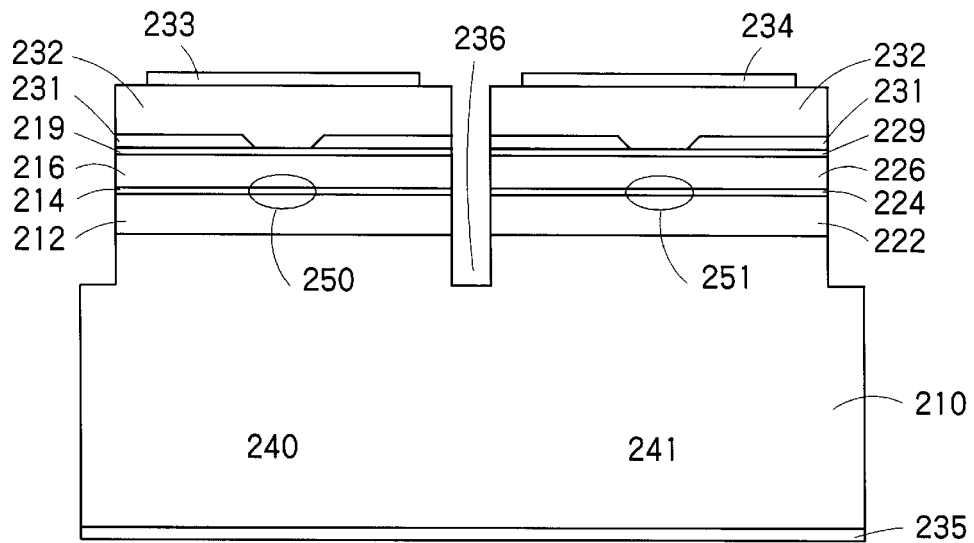
F I G. 24B
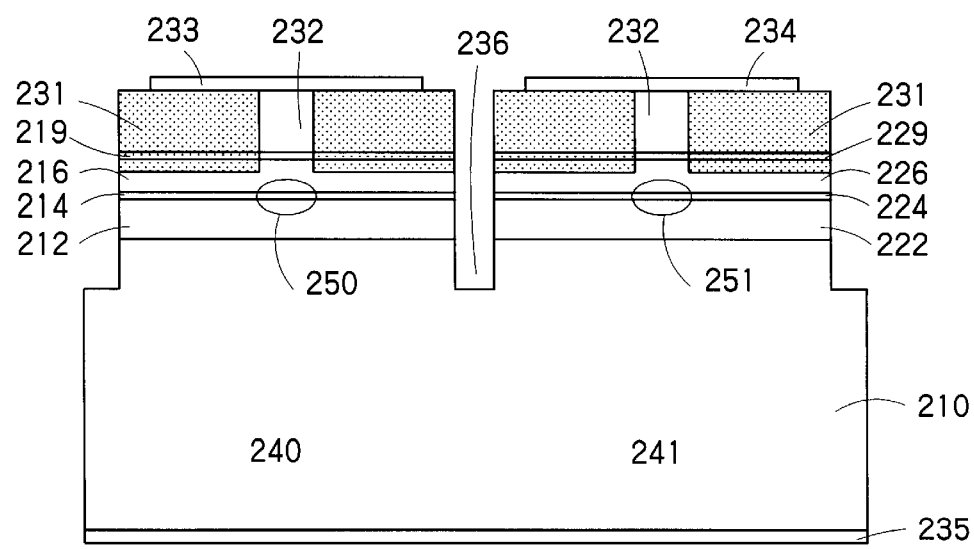
F I G. 24C

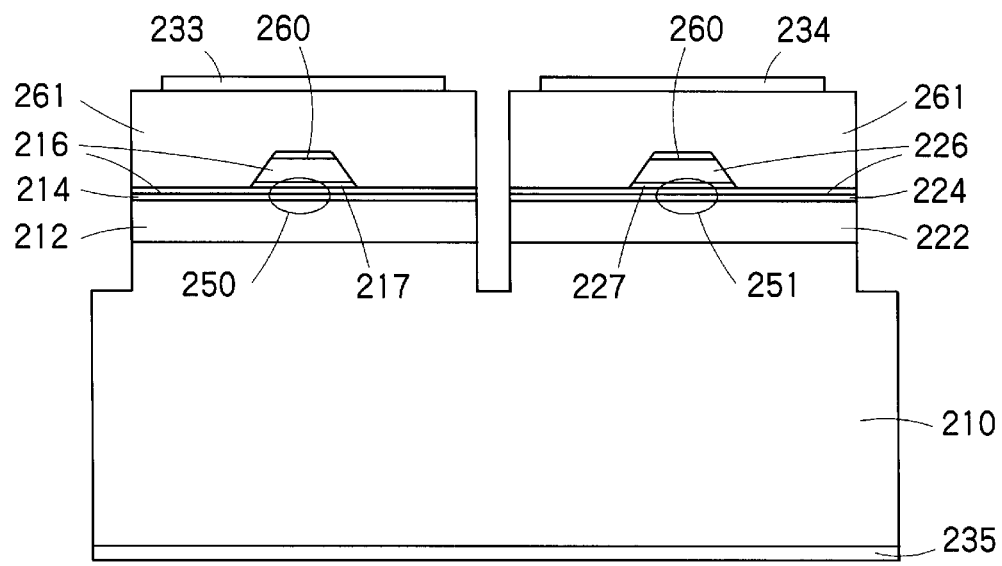
F I G. 24D
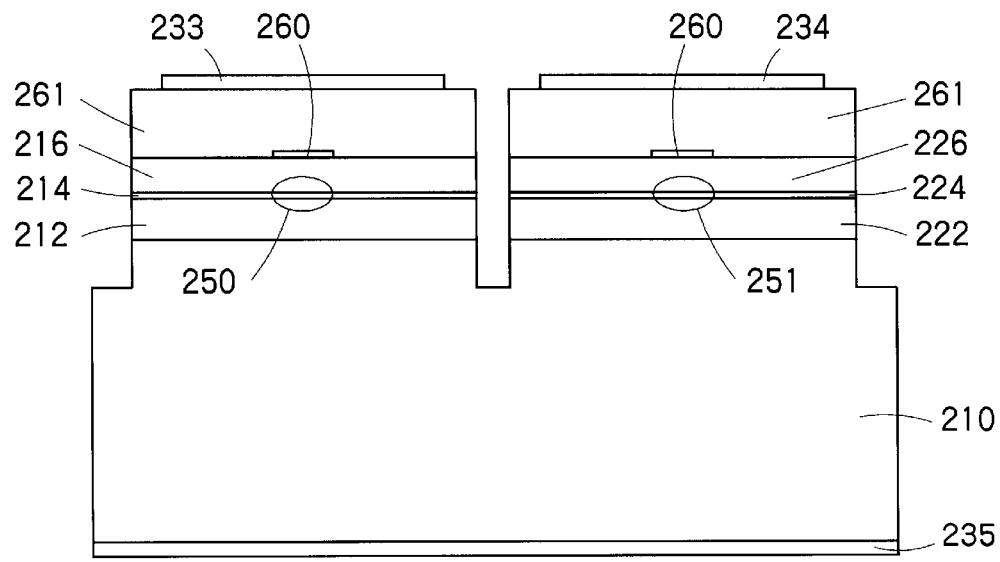
F I G. 24E

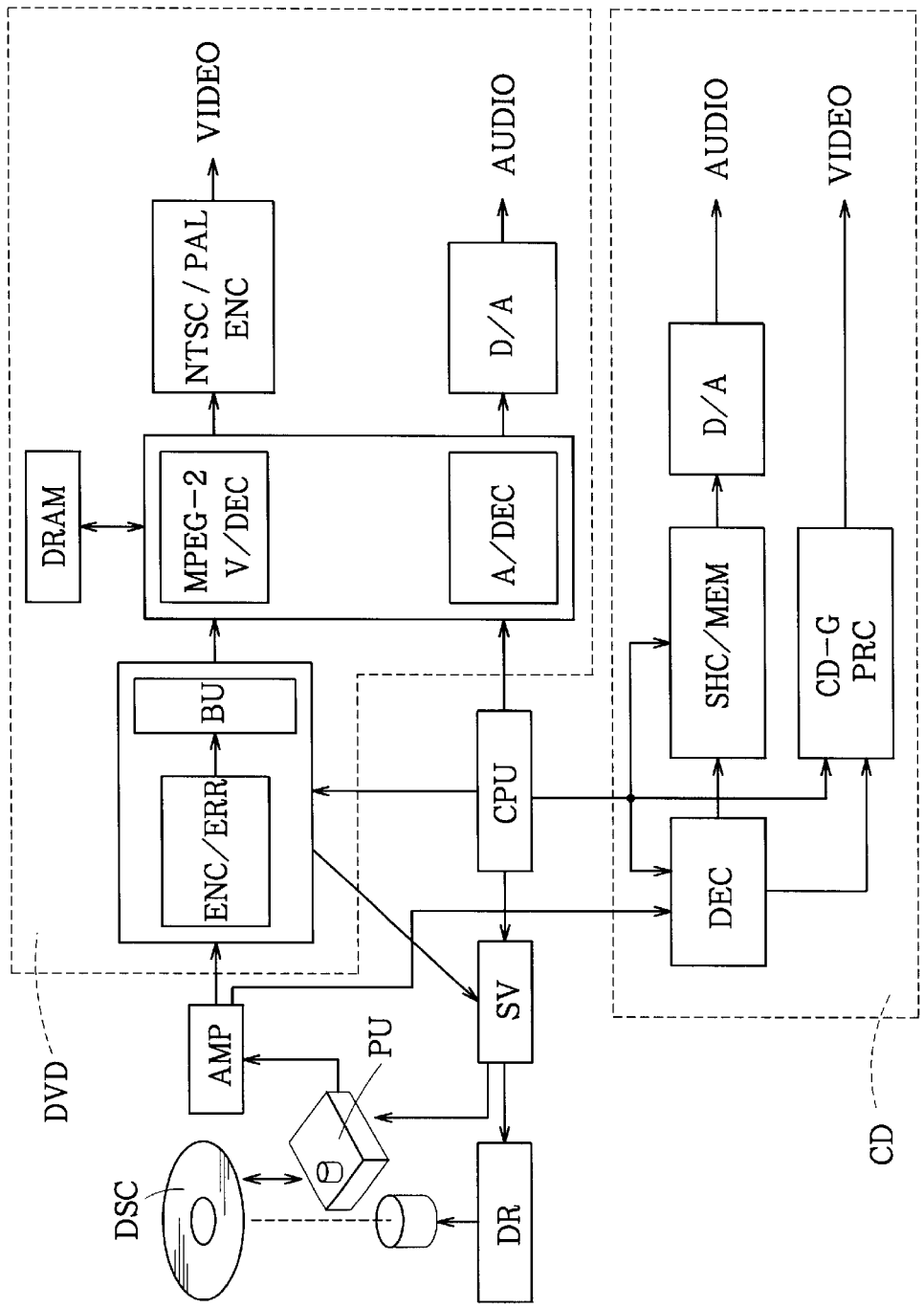
F I G. 25

SEMICONDUCTOR LASER ARRAY AND ITS MANUFACTURING METHOD, OPTICAL INTEGRATED UNIT AND OPTICAL PICKUP

BACKGROUND OF THE INVENTION

This invention relates to a semiconductor laser array and its manufacturing method, optical integrated unit, optical pickup and optical disk driving apparatus. More specifically, the invention relates to a semiconductor laser array for a short wavelength band and its manufacturing method; compact high-performance optical integrated unit, optical pickup and optical disk driving apparatus suitable for use in a compatible optical disk system such as DVD system ensuring compatibility with CD or CD-R, for example, using such a laser.

Optical disk systems are under wide practical use because they are compact but capable of recording a large amount of data. DVD (digital versatile disc) systems, in particular, are under rapid development toward practical use as major systems such as next-generation movies, ROMs and RAMs. On the other hand, CD (compact disc) systems or CD-R (compact disc-recordable) systems have been widely diffused for years, and DVD systems are desired to be compatible with CD systems. That is, DVD systems are required to be capable of reading and writing data on and from CDs or CD-Rs.

In these optical disc systems, an optical pickup using a semiconductor laser (LD) is used to read and write information on and from a disc.

FIG. 26 is an explanatory view showing a typical construction proposed as an optical pickup for conventional DVD systems. The optical pickup shown here has a compatibility with CDs, and includes an optical integrated unit 101 for DVDs and another optical unit 102 for CDs and CD-Rs.

Laser light of the wavelength 650 nm released from the DVD-compatible optical integrated unit 101 passes through a dichroic prism 103, then through a collective lens 104, re-orienting mirror 105, wavelength selecting filter 106 and objective lens 107, and reaches an optical disc 109. On the other hand, laser light of the wavelength 780 nm released from the CD-compatible optical integrated unit 102 is first reflected by the prism 103, then travels the same path as the laser light of 650 nm for DVDs, and reaches CD or CD-R 108.

Return light from the disc travels the optical path in the opposite direction, and reaches the DVD-compatible optical integrated unit 101 or CD-compatible optical integrated unit 102.

In general, since the spot size by the objective lens 107 is slightly different between CD 108 DVD-ROM disk 109, the effective NA (numerical aperture) is changed by using the wavelength selecting filter 106, for example.

Next explained is a conventional optical integrated unit used with the optical pickup shown above.

FIG. 27 is a perspective view schematically showing construction of typical conventional optical integrated units. Optical integrated units 101, 102 have a stem 138 and a heat sink 141 mounted thereon. Adequately provided on the stem 138 are leads 109 for predetermined electrical connection. The heat sink 141 is made of a material having a good heat conductivity, such as copper, and a LD chip 135 and a detecting PD (photodiode) 136 are provided thereon. Monitoring PD 137 is provided behind the LD chip 135 to feedback-control the LD optical output.

Above those elements, a hologram element, not shown, is provided. A stem encapsulating cap is omitted from illustration in FIG. 27.

Light released from the LD chip 135 in the direction shown with an arrow in FIG. 27 reaches the disk through the path explained with reference to FIG. 26. Return light from the disk is diffracted by the hologram, and enters the error detecting PD 136 as shown with an arrow in FIG. 27. PD is divided into some regions for detecting the optical focus and tracking errors on the disk. For example, PD can be designed to equalize quantities of incident light among respective divisional regions when the disk is positioned at a focal point. If it moves from the focal point, then a difference is produced in quantities of incident light among the divisional regions. Therefore, by detecting it as a current difference, it is fed back via a mechanical servo mechanism, not shown, to return the disk to the focal point. Detection of errors in radial directions also follows the same process.

The conventional optical pickup, however, involved problems, namely, complicated construction, difficulty in reducing its size and weight, and the need for complicated assemblage. These problems are discussed below in greater detail.

In the conventional optical pickup shown in FIG. 26, beams of light from two different optical integrated units 101, 102 must be synthesized into a single optical axis because the angular difference of light from LD relative to the optical axis of the pickup must be maintained minimum. For this purpose, it required optical parts like the dichroic prism 103, and this resulted in complicating the construction, increasing the size, complicating the assembling process and increasing the cost.

Moreover, the conventional optical pickup is subject to degradation of the ratio of acceptable products through the assembling process because of the need for the process of adjusting optical axes of two different optical integrated units 101, 102 used therein. That is, also for the positional accuracy (X, Y, θ) of return light from the disk (diffracted light from the hologram), there is a strict requirement. Especially in DVD, the positional accuracy is desired to be within ±5 μm, ±0.50° between LD and PD. Even if the light from LD is within a desired accuracy, expected characteristics are not obtained unless relative positions of PD and LD in each optical integrated unit are held within the above-mentioned acceptable range. That is, since bifurcated optical integrated units are used, relative positional accuracy must be sufficiently high between two LDs and two PDs. The increased number of steps for adjustment required to realize it and degradation in the ratio of acceptable products of the pickup through assemblage are serious problems.

Furthermore, the use of two divisional optical integrated units limits miniaturization of the entirety. Especially when DVD systems are mounted in portable personal computers whose demand is expected to greatly grow in the future, reduction of the size and the weight is indispensable. However, it has been significantly difficult to reduce the size and the weight with the conventional structure as shown in FIG. 26.

SUMMARY OF THE INVENTION

It is therefore an object of the invention to provide a high-performance semiconductor laser array of a multi-wavelength type and its manufacturing method, and to provide a compact, high-performance optical integrated unit, optical pickup and optical disk driving apparatus which can be realized by using such semiconductor lasers.

According to the invention, there is provided a semiconductor laser array comprising: a GaAs substrate; a first laser element portion provided on said substrate to release laser light of a first wavelength; and a second laser element portion provided on said substrate to release laser light of a second wavelength different from said first wavelength in a direction substantially parallel to the laser light of the first wavelength, said first laser element portion including a first cladding layer, an active layer formed by epitaxially growing a first semiconductor material on said first cladding layer, a second cladding layer formed on said active layer and a current-blocking layer to confine an electrical current injected into said first laser element portion, said second laser element portion including a first cladding layer, an active layer formed by epitaxially growing a second semiconductor material on said first cladding layer, a second cladding layer formed on said active layer and a current-blocking layer to confine an electrical current injected into said second laser element portion, and said current-blocking layer of said first laser element portion and said current-blocking layer of said second laser element portion are made of same semiconductor material.

According to the invention, there is further provided a semiconductor laser array comprising:

a GaAs substrate;

a first laser element portion provided on said substrate to release laser light of a first wavelength; and a second laser element portion provided on said substrate to release laser light of a second wavelength different from said first wavelength in a direction substantially parallel to the laser light of the first wavelength, said first laser element portion including a first cladding layer made of InGaAlP, an active layer formed on said first cladding layer, a second cladding layer formed on said active layer and made of InGaAlP, a stripe-shaped intermediate layer formed on said second cladding layer and made of a semiconductor material having a smaller band gap than said second cladding layer, and top layer formed to cover said second cladding layer and said intermediate layer and made of a semiconductor material having a smaller band gap than said intermediate layer.

said second laser element portion including a first cladding layer made of InGaAlP, an active layer formed on said first cladding layer, a second cladding layer formed on said active layer and made of InGaAlP, a stripe-shaped intermediate layer formed on said second cladding layer and made of a semiconductor material having a smaller band gap than said second cladding layer, and top layer formed to cover said second cladding layer and said intermediate layer and made of a semiconductor material having a smaller band gap than said intermediate layer.

According to the invention, there is further provided a manufacturing method of a semiconductor laser array having a GaAs substrate, a first laser element portion provided on said substrate to release laser light of a first wavelength, and a second laser element portion provided on said substrate to release laser light of a second wavelength different from said first wavelength in a direction substantially parallel to the laser light of the first wavelength, comprising the steps of:

making a double-heterostructure of a first cladding layer, an active layer and a second cladding layer forming said first laser element portion in a location on a major surface of said GaAs substrate;

making a double-heterostructure of a first cladding layer, an active layer and a second cladding layer forming said second laser element portion on another location on said major surface of said GaAs substrate;

selectively etching said second cladding layer of said first laser element portion and said second cladding layer of said second laser element portion simultaneously to form stripes extending along laser cavity lengthwise directions, respectively; and making an element separation groove between said first laser element portion and said second laser element portion to block an electric current therebetween.

According to the invention, there is further provided a manufacturing method of a semiconductor laser array having a GaAs substrate, a first laser element portion provided on said substrate to release laser light of a first wavelength, and a second laser element portion provided on said substrate to release laser light of a second wavelength different from said first wavelength in a direction substantially parallel to the laser light of the first wavelength, comprising the steps of:

making a double-heterostructure of a first cladding layer, an active layer and a second cladding layer forming said first laser element portion in a location on a major surface of said GaAs substrate;

making a double-heterostructure of a first cladding layer, an active layer and a second cladding layer forming said second laser element portion on another location on said major surface of said GaAs substrate;

making intermediate layers having a smaller band gap than said second cladding layers on said second cladding layers of said first and second laser element portions;

selectively etching said intermediate layers of said first and second laser element portions simultaneously to form stripes extending along laser cavity lengthwise directions, respectively;

making top layers having a smaller band gap than said intermediate layers over said first and second laser element portions; and making an element separation groove between said first laser element portion and said second laser element portion to block an electric current therebetween.

When the first wavelength is longer than the second wavelength, the step of making the double-heterostructure of the first laser element portion preferably precede the step of making the double-heterostructure of the second laser element portion.

The second cladding layer of the first laser element portion may have a p-type conduction type and its p-type carrier density is preferably not larger than $8 \times 10^{17}$ cm$^{-3}$.

The step of making the stripes may include a step of selective etching terminated at etching stop layers provided in the first laser element portion and the second laser element portion, respectively.

The first wavelength may range about 780 nm as its center, and the second wavelength may range about one of 635 nm or 650 nm as its center.

According to the invention, there is further provided an optical integrated unit comprising: a integrated laser array including a first laser element portion and second laser element portion integrated on a common substrate, said first laser element portion releasing laser light of a first wavelength, said second laser element portion releasing light of a second wavelength different from said first wavelength in a direction substantially parallel to the laser light of said first wavelength; and detector means for detecting first return light which is part of the laser light of said first wavelength reflected back in the exterior and second return light which is part of the laser light of said second wavelength reflected back in the exterior.

According to the invention, there is further provided an optical integrated unit comprising: a first laser element portion releasing laser light of a first wavelength; a second laser element portion releasing light of a second wavelength different from the first wavelength in a direction substantially parallel to the laser light of the first wavelength; and holographic optical element for diffracting first return light which is part of the laser light of the first wavelength reflected back in the exterior by a first diffraction angle and diffracting second return light which is part of the laser light of the second wavelength reflected back in the exterior by a second diffraction angle different from the first diffraction angle; and detector means for detecting the first return light and the second return light diffracted by the holographic optical element at a substantially common detecting position.

According to the invention, there is further provided an optical integrated unit comprising: a first laser element portion releasing laser light of a first wavelength; a second laser element portion releasing light of a second wavelength different from the first wavelength in a direction substantially parallel to the laser light of the first wavelength; first detector means for detecting first return light which is part of the laser light of the first wavelength reflected back in the exterior; and second detector means for detecting second return light which is part of the laser light of the second wavelength reflected back in the exterior.

According to the invention, there is further provided an optical integrated unit comprising: a first laser element portion releasing laser light of a first wavelength; a second laser element portion releasing light of a second wavelength different from the first wavelength in a direction substantially parallel to the laser light of the first wavelength; and holographic optical element for diffracting first return light which is part of the laser light of the first wavelength reflected back in the exterior by a first diffraction angle and diffracting second return light which is part of the laser light of the second wavelength reflected back in the exterior by a second diffraction angle different from the first diffraction angle; first detector means for detecting the first return light diffracted by the holographic optical element; and second detector means for detecting the second return light diffracted by the holographic optical element.

The first detector means and the second detector means may be any of a plurality of photo diodes integrated on a common substrate.

Any of the optical integrated elements summarized above may further comprise a third laser element portion releasing laser light of a third wavelength.

The first laser element portion and the second laser element portion may form a laser array integrated on a common substrate.

The laser array may be a semiconductor laser array recited in one of claims 1 to 5.

The optical integrated unit summarized above may further comprise a silicon substrate having at least one step portion on a major surface thereof, the laser array being mounted on a lower part of the major surface at one side of the step portion of the silicon substrate to release the laser light of the first wavelength and the laser light of the second wavelength toward a side surface of the step portion, the side surface of the step portion including a reflector portion for reflecting the laser light of the first wavelength and the laser light of the second wavelength approximately perpendicularly upward relative to the major surface of the substrate.

The holographic optical element may have a hologram element.

The first wavelength may range about 780 nm as its center, and the second wavelength may range about one of 635 nm, 650 nm and 685 nm as its center.

According to the invention, there is further provided an optical pickup comprising: an optical integrated unit including a integrated laser array and detector means, said integrated laser array including a first laser element portion and second laser element portion integrated on a common substrate, said first laser element portion releasing laser light of a first wavelength, said second laser element portion releasing light of a second wavelength different from said first wavelength in a direction substantially parallel to the laser light of said first wavelength, said detector means detecting first return light which is part of the laser light of said first wavelength reflected back in the exterior and second return light which is part of the laser light of said second wavelength reflected back in the exterior; and holographic optical element for diffracting first return light which is part of the laser light of said first wavelength reflected back in the exterior by a first diffraction angle and diffracting second return light which is part of the laser light of said second wavelength reflected back in the exterior by a second diffraction angle different from said first diffraction angle.

According to the invention, there is further provided an optical pickup comprising: an optical integrated unit including a integrated laser array and detector means, said integrated laser array including a first laser element portion and second laser element portion integrated on a common substrate, said first laser element portion releasing laser light of a first wavelength, said second laser element portion releasing light of a second wavelength different from said first wavelength in a direction substantially parallel to the laser light of said first wavelength, said detector means detecting first return light which is part of the laser light of said first wavelength reflected back in the exterior and second return light which is part of the laser light of said second wavelength reflected back in the exterior; and an optical system for converging laser light of a first wavelength released from said optical integrated unit or laser light of a second wavelength and irradiating it onto an optical disk, and for guiding light reflected back from said optical disk to said optical integrated unit.

According to the invention, there is further provided an optical disk driving apparatus comprising one of optical pickups summarized above.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 1 is a diagram schematically showing the optical system of an optical pickup according to the invention;

FIGS. 2A and 2B are diagrams schematically showing constructions of optical systems employable as the optical integrated unit according to the invention;

FIGS. 3A and 3B are schematic diagrams for explaining the optical path in the optical integrated unit according to the invention, in which FIG. 3A shows the aspect of light diffracted by a typical hologram element, and FIG. 3B shows the optical path in the optical integrated unit according to the invention;

FIG. 5 is a perspective view schematically showing construction of a central part of the optical integrated unit according to the invention;

FIG. 6 is a perspective view schematically showing such an upside-down mounted configuration;

FIG. 9 is a cross-sectional view showing construction of a semiconductor laser array according to the invention;

FIG. 10 is a cross-sectional view schematically showing a process in a manufacturing method of a semiconductor laser array according to the invention;

FIG. 11 is a cross-sectional view schematically showing a process in the manufacturing method of the semiconductor laser array according to the invention;

FIG. 12 is a cross-sectional view schematically showing a process in the manufacturing method of the semiconductor laser array according to the invention;

FIG. 13 is a cross-sectional view schematically showing a process in the manufacturing method of the semiconductor laser array according to the invention;

FIG. 14 is a cross-sectional view schematically showing a process in the manufacturing method of the semiconductor laser array according to the invention;

FIG. 15 is a cross-sectional view schematically showing a process in the manufacturing method of the semiconductor laser array according to the invention;

FIG. 16 is a cross-sectional view schematically showing a process in the manufacturing method of the semiconductor laser array according to the invention;

FIG. 17 is a cross-sectional view schematically showing a process in the manufacturing method of the semiconductor laser array according to the invention;

FIG. 18 is a cross-sectional view schematically showing a process in the manufacturing method of the semiconductor laser array according to the invention;

FIGS. 20A and 20B are graphs showing current-optical output characteristics and oscillation spectrums of a laser element portion for the wavelength 780 nm in the semiconductor laser array according to the invention;

FIGS. 21A and 21B are graphs showing current-optical output characteristics and oscillation spectrums of a laser element portion for the wavelength 750 nm in the semiconductor laser array according to the invention;

FIGS. 22A and 22B are graphs showing current-optical output characteristics and oscillation spectrums of the oscillation wavelength 780 nm in a semiconductor laser array, taken as another example of the invention;

FIGS. 23A and 23B are graphs showing current-optical output characteristics and oscillation spectrums of the oscillation wavelength 780 nm in the semiconductor laser array;

FIGS. 24A through 24E are cross-sectional views showing construction of other examples of the invention;

FIG. 25 is a block diagram of the optical disk driving apparatus according to the invention;

DETAILED DESCRIPTION OF THE PREFERRED EMBODIMENTS

Figure 4A:
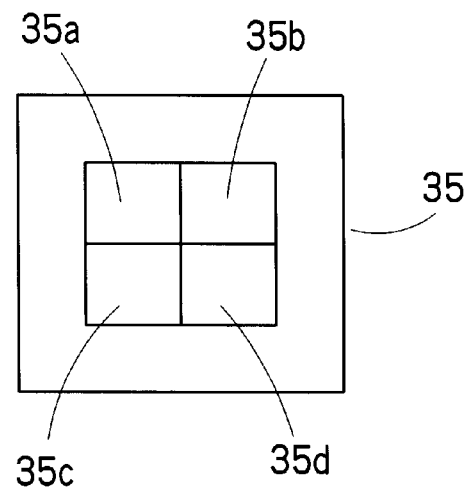
FIG. 4A is a schematic plan view of a photodetector PD 35.

The invention provides a semiconductor laser array of a multi-wavelength type having a unique structure, and its manufacturing method. Additionally, the invention provides compatible optical integrated unit, optical pickup and DVD system which need less number of parts than conventional ones and can be remarkably reduced in size and weight by using the semiconductor laser array.

Description is started below with explanation of an optical pickup and an optical integrated units according to the invention, and description will be continued on a semiconductor laser array and its manufacturing method according to the invention. Finally, an optical disk driving apparatus according to the invention will be explained.

Embodiments of the invention are explained below with reference to the drawings.

FIG. 1 is a diagram schematically showing the optical system of an optical pickup according to the invention. In this embodiment, laser light of the wavelength 650 nm or 635 nm for DVD and laser light of the wavelength 780 nm for CD and CD-R are released from a single optical integrated unit 11. These beams of laser light travel through the collimator lens 14, re-orienting mirror 15, wavelength selecting filter 16 and objective lens 17, and reaches CD 18 or DVD disc 19.

The collimator lens 14 is a convex lens for converging LD light, and its NA may be usually within 0.1 to 0.15. The objective lens 12 functions to converge LD light onto the disc.

Figure 26:
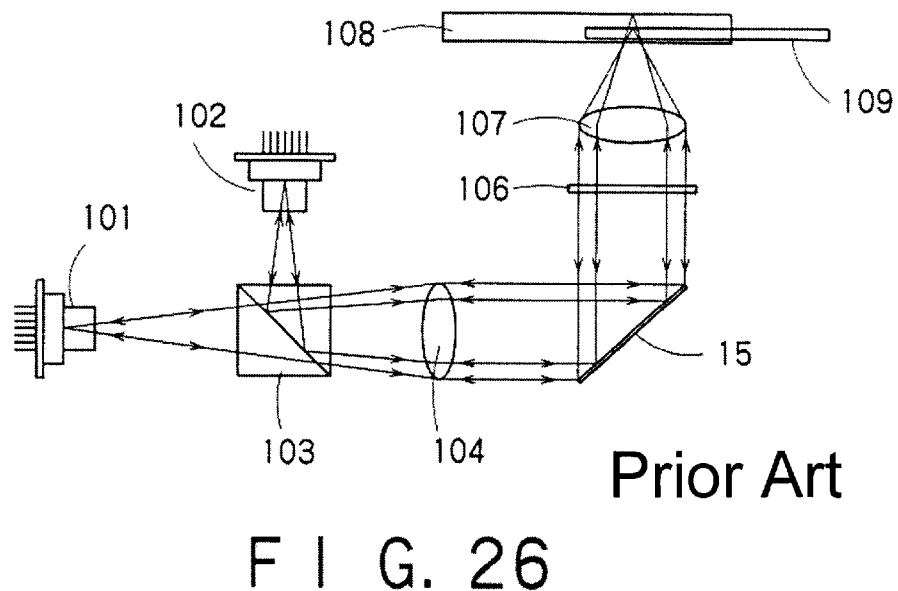
FIG. 26 is an explanatory view showing a typical construction proposed as an optical pickup for conventional DVD systems.
Figure 27:
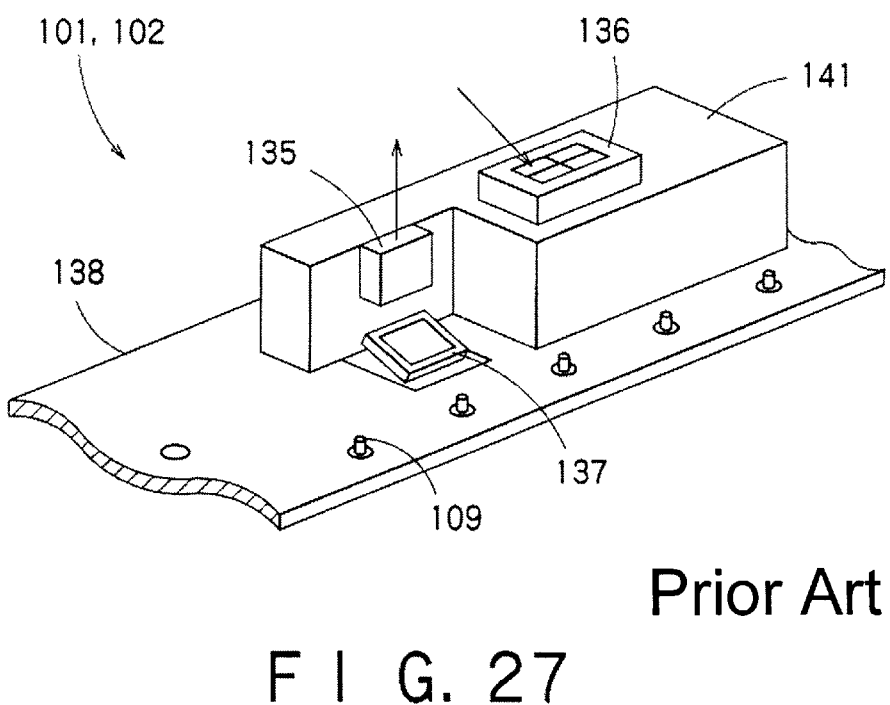
FIG. 27 is a perspective view schematically showing construction of typical conventional optical integrated units.

Comparing the optical pickup according to the invention with the conventional structure shown in FIG. 26, it is apparent that the optical system is much simpler because a single optical integrated unit is used.

FIGS. 2A and 2B are diagrams schematically showing constructions of optical systems employable as the optical integrated unit according to the invention. In these drawings, the portion shown by the broken line is the optical integrated unit 11. The optical integrated unit 11 includes LD 31 and detector PD 35. In FIG. 2A, the optical integrated unit also includes holographic optical element 33. LD 31 releases laser light of two wavelengths, 650 nm and 780 nm.

The holographic optical element 33, i.e. the hologram element system, may be integral with the optical integrated unit 11 as shown in FIG. 2A or may be a separate member from the optical integrated unit 11 as shown in FIG. 2B. For example, it may be interposed between the collimator lens 14 and the re-orienting mirror 15, between the re-orienting mirror 15 and the filter 16 or between the filter 16 and the objective lens 17, for example. In the explanation made below, however, the hologram element is integral with the optical integrated unit 11. For simplification, explanation is made as omitting the quarter wavelength plate.

The hologram element usable in this embodiment permits light from LD to pass therethrough, diffracts diffracted light of a certain order in return light from the disk to a target position of detector PD 35, and converges it by the function of the collimate lens 14. Usable as the hologram element is a micro diffraction grating having a transfer function so designed that incident light onto a predetermined position of its surface be diffracted to a target point on PD. Its pitch need not be uniform.

Detector PD 35 has a plurality of divisional photodetective regions, which will be explained later in greater detail, and can detect focus errors and tracking errors as well. In the illustrated example, both the laser light of 780 nm and the laser light of 650 nm are detected by the same detector PD 35.

Laser light released from LD 31 passes through the hologram element 33 and exits from the optical integrated element 11. It is then converged by the collimator lens 14 and enters the objective lens 17 through an optical system, not shown. In FIGS. 2A and 2B, X denotes a row of track pits of the disk, and Y denotes a radial direction of the disk.

Return light reflected from the disk and travelling the path in the opposite direction is diffracted by the hologram element 33 and enters into the detector PD 35.

Function of the optical integrated unit 11 is next explained quantitatively.

FIGS. 3A and 3B are schematic diagrams for explaining the optical path in the optical integrated unit according to the invention. FIG. 3A shows the aspect of light diffracted by a typical hologram element, and FIG. 3B shows the optical path in the optical integrated unit according to the invention.

As shown in FIG. 3A, the hologram element 33 has a diffraction grating having formed periodic grooves on the surface of a transparent material like glass. Explanation is made below on an example in which return light RL from the optical disk, not shown, enters downward in the figure. In this case, there is a 0-th-order optical component TL passing through the hologram element 33 and travelling straight. Simultaneously, there are diffracted light components DLM and DLP diffracted by the hologram element. Its diffraction angle θ is expressed as $$\sin \theta = n\lambda/d \quad (1)$$

where d is the pitch of the diffraction grating is d, and λ is the wavelength of the laser light. n is an integer and called "order of diffraction". In FIGS. 3A and 3B, lights generated by the first-order diffraction, namely, diffraction of n=1, are shown as DLM and DLP.

Next explained is the optical path in the optical integrated unit according to the invention with reference to FIG. 3B. Here is shown an example using laser light L2 of the wavelength 650 nm for DVD discs and laser light L1 of the wavelength 780 nm for CDs (and CD-Rs). Beams of light of these wavelengths are released from LD 31. LD 31 is a semiconductor laser element having two cavities aligned in parallel with a predetermined distance as explained later in greater detail. Laser lights L1 and L2 from LD 31 pass through the hologram element 33 and reaches the disk, not shown. Respective elements are positioned to ensure that return light from the disk passes through the hologram element 33, and a first-order diffraction light therein returns to the predetermined position of the detector PD 35. The optical system of the collimator lens 14 and the re-orienting mirror 15 as shown in FIGS. 1, 2A and 2B are omitted here for simplicity. Actually, however, the hologram element 33 may be interposed between LD 31 and collimator lens 14, between the collimator lens 14 and the re-orienting mirror 15 or between the re-orienting mirror 15 and the objective lens 17.

As shown in FIG. 3B, when return lights RL1 and RL2 are diffracted by the hologram element 33, the diffraction angle of the laser light RL1 of 780 nm is larger than that of the laser light RL2 of 650 nm as apparent from Equation (1). Therefore, by locating the beam center of the 780 nm light (31B) and the photodetector PD 35 in opposite sides of the beam center of the 650 nm light (31A) and by appropriately determining their positional relation and the pitch of the diffraction grating, it is imaging positions near focal points of beams of both wavelengths can be brought into coincidence. That is, the diffracted beams DL1P and DL2P can be converged onto the same position on the detector PD 35.

In a typical example determining the distance between LD beams as 200 μm, the distance between the beam center 31A of the 650 nm light and the center of the photodetector PD 35 as 800 μm, the interval between LD and the hologram element 33 as 5 mm, the minimum pitch of the diffraction grating of the hologram element 33 may be determined as 3 μm. However, the invention is not limited to this particular construction, but the LD beam distance, the positional relation with the photodetector PD 35, and so on, can be chosen appropriately.

However, in order to ensure practical values of the pitch of the diffraction grating, positional relation between LD 31 and photodetector PD 35, and so forth, the distance between the beam centers 31A and 31B of LD 31 should be within decades to hundreds of μm, approximately. For this purpose, a plurality of LD chips may be aligned. However, it is not easy to align a plurality of LD chips with such a fine distance. Furthermore, it is not easy to bring optical axes of respective LD chips into coincidence. Therefore, in the optical integrated unit according to the invention, it is preferable to use a laser array integrating two or more different kinds of cavities in a single LD chip. As will be explained later in greater detail, by using a semiconductor laser array according to the invention, an optical integrated unit according to the invention can be realized very easily.

Next explained is the photodetector PD.

FIG. 4A is a schematic plan view of the photodetector PD 35. The photodetector PD 35 is divided into a plurality regions as illustrated. By employing this PD, a method relying astigmatism can be used for detecting focus errors. For detecting tracking errors, a phase contrast detecting method can be used. Assume, for example, that photodetective currents Ia, Ib, Ic and Id are generated in the four divisional regions 35a, 35b, 35c and 35d of the photodetector PD 35, respectively. Then, tracking errors can be detected through a phase contrast between (Ib+Ic) and (Ia+Id). Focus errors can be detected by a positive or negative value of (Ib+Ic)−(Ia+Id). Needless to say, also usable are a 3-beam method, push-pull method for detecting tracking errors, Foucault method and spot size detection for detecting focus errors.

The RF signal as the data signal read out from the disc is normally (Ia+Ib+Ic+Id).

Figure 4B:
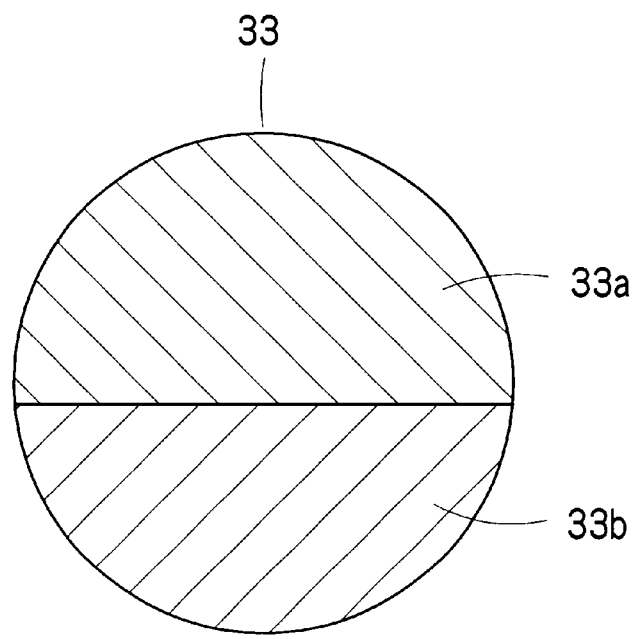
FIG. 4B is a schematic plan view of the hologram element 33.

FIG. 4B is a schematic plan view of the hologram element 33. The hologram element 33 may be divided into a plurality regions in this fashion. Respective divisional regions may be slightly offset in their diffraction gratings from each other. With the hologram element 33 divided into a plurality of regions, even when the optical axes deviate or the disk inclines, one or some of the divisional regions can diffract return light, and can converge it onto the detector PD. That is, the allowance for deviation of optical axes, for example, can be enlarged. The dividing lines may be perpendicular to the tracks 10 shown in FIG. 2. In this manner, the allowance for axial deviation and inclination of the disc, for example, can be improved.

FIG. 5 is a perspective view schematically showing construction of a central part of the optical integrated unit according to the invention. A heat sink 41 is fixed on a stem substrate 38, and LD 31 is mounted on a side surface of the heat sink 41 by soldering, for example. Detector PD 35 is mounted on the heat sink 41. The substrate 38 is made of KOVAR, for example, and the heat sink 41 is made of copper (Cu) or tungsten-copper (W—Cu) alloy, for example. A monitor PD 37 is provided behind LD 31 to control monitor output from LD 31 and feedback control it. Formed on the substrate 38 are appropriate air-tight encapsulating electrode leads 39, and they are adequately connected to LD 31, PD 35 and 37 by wires, not shown.

As illustrated, laser light 31A and laser light 31B of two different wavelengths are released from LD 31. In order to fix LD 31 to the heat sink 41, angular deviation of these light beams is preferably held not larger than ±0.5°. The monitor PD 37 can be commonly used because LD 31 need not simultaneously release two laser beams different in wavelength.

A light beam released from LD 31 and travelling through an optical system, not shown, is reflected by the disk, and its return light is diffracted by a hologram element, not shown, and its first-order diffraction light returns to the detector PD 35. In DVD systems having small track pitches, the requirement for accuracy of relative positions (X, Y, θ) between LD 31 and PD 35 is severe, and they are preferably held within ±5 $\mu$m, ±0.5°. After these elements are assembled into the form shown in FIG. 5, wires, not shown, are connected, and the structure is enclosed by a cap.

The hologram element 33 shown in FIGS. 4A, 4B and others is next bonded on the cap with a sufficient positional accuracy relative to the detector PD 35. However, as explained before, the hologram element 33 may be located at a position distant from the cap, namely, before or after the collimator lens 14, or before or after the objective lens 17.

In the example shown in FIG. 5, LD 35 is bonded to the heat sink 41 with one side of its common n-electrode. However, taking account for the temperature property of 650 nm light for DVDs having a small margin, it is advantageous to improve the heat radiation property of LD 31 as far as possible. For this purpose, LD may be bonded to the heat sink 41 with another side of its p-electrode which is nearer to the light emitting portion.

FIG. 6 is a perspective view schematically showing such an upside-down mounted configuration. In the example shown here, LD 31 is mounted in an upside-down configuration via a substrate 50. The substrate 50 is preferably insulating and good in heat conduction. A desirable material thereof is aluminum nitride (AlN). In this case, p-side and n-side electrodes of LD 31 are connected to leads 39 by wires W, respectively.

Next explained are third examples of the present invention.

Figure 7A:
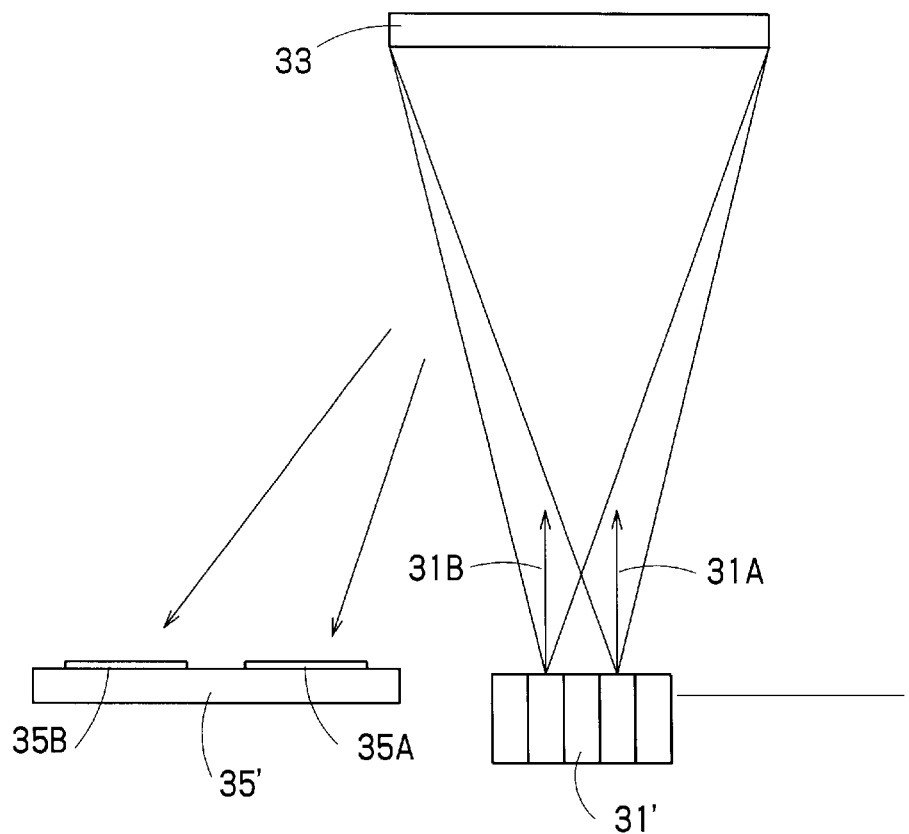
FIGS. 7A and 7B are diagrams schematically showing the third examples of the invention.
Figure 7B:
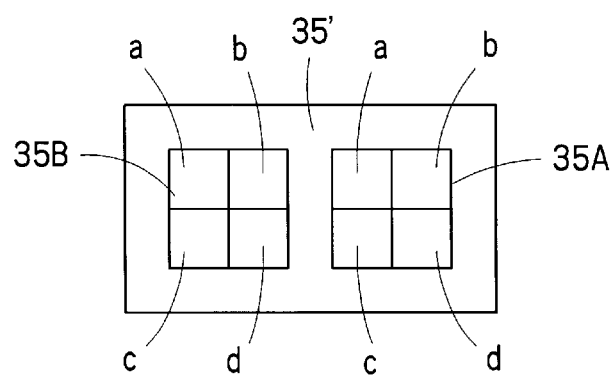

FIGS. 7a and 7B are diagrams schematically showing the third examples of the invention. FIG. 7A shows an example in which two beams 31A and 31B from LD 31' are brought closer to 50 $\mu$m. This is optically preferable because emission points of two beams may be much closer as compared with the construction shown in FIGS. 4A and 4B, and both beams can be converged easily. However, as to return light from the disk, not shown, since it expands due to differences in diffraction angle of the hologram element 33, it does not make a single projection point on the detector PD 35', and it becomes difficult to receive light as a single PD pattern. Therefore, the use of a plurality of PDs as illustrated is preferable. FIG. 7B shows an example having two PD patterns 35A, 35B on a single silicon substrate 35'. Each of the PD patterns 35A, 35B is divided into four photodetective regions a through d. The use of a plurality of PD patterns on a single silicon substrate is easy from both the technical and economical viewpoints, and does not disturb practical use of this example.

In the example shown in FIGS. 7A and 7B, PD 35A for 650 nm and PD 35B for 780 nm are made on the single silicon substrate 35'. However, the same purpose is attained by making them as separate chips. In a specific numerical example, the distance between the 650 nm beam center 31A and the center of the 650 nm PD 35A is approximately 1.1 mm, the distance between the 650 nm beam center 31A and the center of the 780 nm PD 35B is about 1.3 mm, the minimum pitch of the diffraction grating of the hologram element 33 is about 3 $\mu$m, and the distance of LD 31' and the hologram element 33 is about 5 mm.

Further, by appropriately determining the distance between the hologram element 33 and LD 31 and the pitch of the hologram element 33, both of the beam centers 31A and 31B can be adjusted to 650 nm or 780 nm.

Next explained is a fourth example of the invention.

Figure 8:
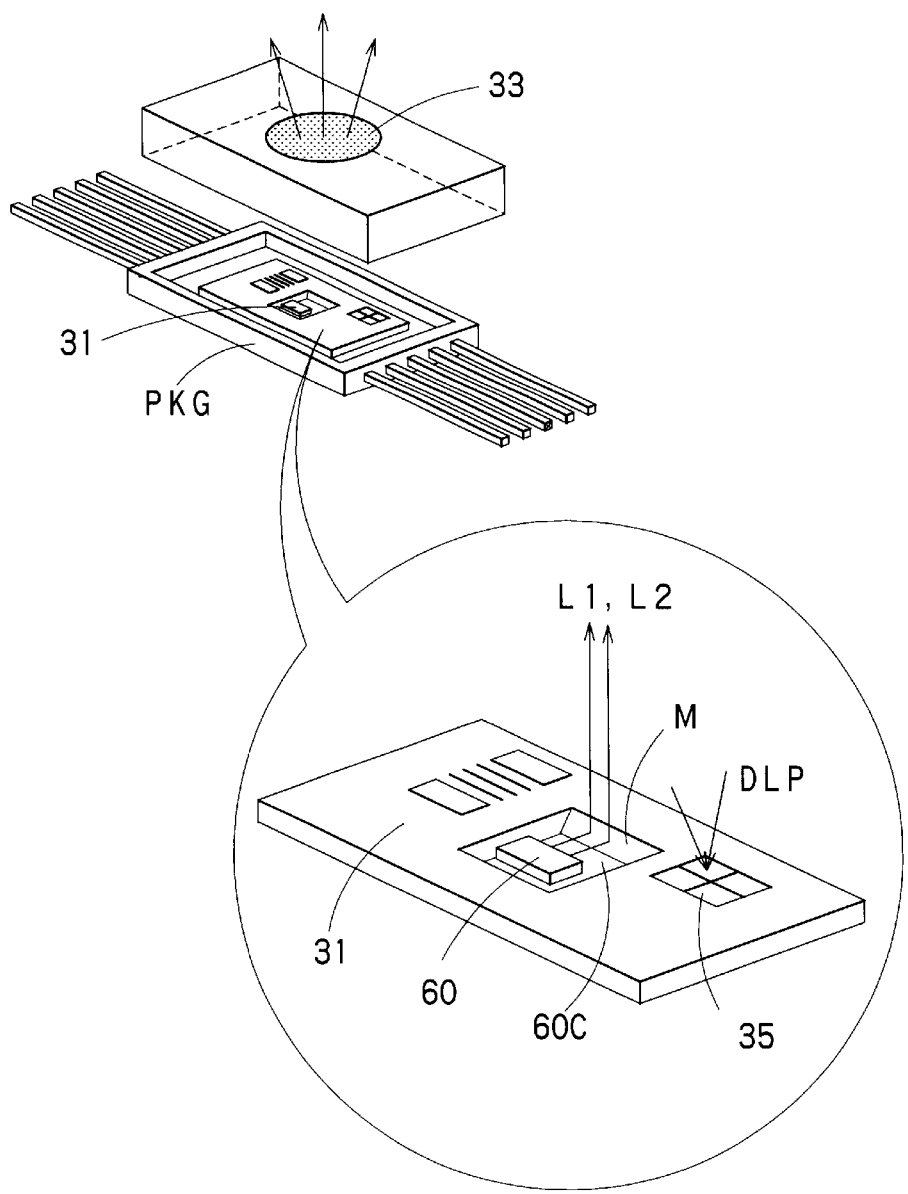
FIG. 8 is an exploded perspective view of a central part of an optical integrated unit taken as a fourth example of the invention, combined with an enlarged perspective view of its substrate portion.

FIG. 8 schematically shows the fourth example of the invention. FIG. 8 is an exploded perspective view of a central part of the optical integrated unit according to the invention, combined with an enlarged perspective view of its substrate portion. In this example, a recess 60C is made on the major surface of the substrate 60, and LD 31 is mounted on its bottom. Beams L1 and L2 from LD 31 are reflected and re-oriented upward by a mirror M formed on a side surface of the recess 60C. These laser beams L1 and L2 pass through the hologram element 33, travel through an optical system, not shown, and enter into the disk. Return lights DLP from the disk is diffracted by the hologram element 33, and enters into the detector PD 35 provided on the substrate 60. The substrate 60 may be made of silicon, for example, and its (111) plane made by etching, for example, may be made as the mirror M.

Also in this example, by appropriately positioning LD 31 and other elements similarly to those of the foregoing examples, the optical system as shown in FIGS. 4A and 4B or FIGS. 7A and 7B can be realized.

This example enables realization of a very thin, compact optical integrated unit including a package PKG.

Heretofore explained are optical integrated units and optical pickup apparatuses according to the invention by way of specific examples. In these examples, a single LD chip functions as two cavities. However, also usable is an element integrating three cavities, for example, on a single LD chip. One of such examples is LD integrating three kinds of elements for 650 nm light for DVD-ROM, 635 nm light for DVD-ROM, and 780 nm light for CD-ROM and CD-R. Another example is LD incorporating three kinds of elements for 650 nm light for DVD-ROM, 650 nm light for DVD-RAM (high-output light for writing) and 780 nm light for CD-ROM and CD-R. Still another example is LD integrating three kinds of elements for 650 nm light for DVD-ROM, 780 nm light for (CD-ROM and CD-R (light for reading) and 780 nm light for CD-R and CD-RW (high-output light for writing).

Further, if LD of a wavelength band near 685 nm, compatibility with rewritable optical disk systems of a magnet-optic type or a phase change type can be ensured.

Next made is detailed explanation on LD, i.e. integrated semiconductor laser array, according to the invention.

FIG. 9 is a schematic cross-sectional view of an integrated semiconductor laser array according to the invention. The semiconductor laser array shown here includes cavities for emitting light of 650 nm and light of 780 nm, respectively, integrated on a common GaAs substrate 210. The essence of the invention lies in enabling collective execution of the process for controlling transverse modes of respective integrated lasers, process for making current-blocking structures and process for burying them by making double-heterostructures having different parameters in different regions on a semiconductor substrate and designing upper portions of cladding layers of the double-heterostructures in respective regions substantially commonly.

The laser array includes a GaAs substrate 210, a first laser element portion 240 provided on said substrate 210 to release laser light of a first wavelength and a second laser element portion 241 provided on said substrate 210 to release laser light of a second wavelength different from said first wavelength in a direction substantially parallel to the laser light of the first wavelength.

The first laser element portion 240 includes a first cladding layer 212, an active layer 214 formed by epitaxially growing a first semiconductor material on said first cladding layer 212, a second cladding layer 216 and 218 formed on the active layer 214 and a current-blocking layer 231 to confine an electrical current injected into the first laser element portion 240.

The second laser element portion 241 includes a first cladding layer 222, an active layer 224 formed by epitaxially growing a second semiconductor material on the first cladding layer 222, a second cladding layer 226 and 228 formed on the active layer 224 and a current-blocking layer 231 to confine an electrical current injected into the second laser element portion 241.

The current-blocking layer 231 of the first laser element portion 240 and the current-blocking layer 231 of the second laser element portion 241 are made of same semiconductor material.

The first and second cladding layers 212, 216, 218, 222, 226 and 228 of the first and second laser element portions may be made of AlGaAs, and the current-blocking layers 231, 231 of the first and second laser element portions 240 and 241 may be made of GaAs.

The group-V species included in the second cladding layer 216 and 218 of said first laser element portion 240 may not be identical to group-V species included in the current-blocking layer 231, and group-V species included in the second cladding layer 226 and 228 of the second laser element portion 241 may not be identical to group-V species included in the current-blocking layer 231.

The first and second cladding layers 212, 216 and 218 of said first laser element portion 240 and said first and second cladding layers 222, 226 and 228 of said second laser element portion 241 may be made of same semiconductor material.

The first and second cladding layers 212, 216, 218, 222, 226 and 228 of said first and second laser element portions may be made of InGaAlP or InAlP.

The second cladding layer 228 of the second laser element portion 241 may be configured as a ridge stripe extending along laser cavity lengthwise directions and both sides of the ridge stripe is buried by the current-blocking layer 231.

The first wavelength may range about 780 nm as its center, and said second wavelength may range about one of 635 nm, 650 nm and 685 nm as its center.

The active layer 214 of the first laser element portion 240 may include an AlGaAs layer, and the active layer 224 of the second laser element portion 241 may include an InGaP or InGaAlP layer.

The active layer 224 of the second laser element portion 241 may include an $In_{0.5}(Ga_{1-x}Al_x)_{0.5}P(0 \leq x \leq 0.2)$ layer.

The active layer 214 of the first laser element portion 240 may have a bulk structure and the active layer 224 of the second laser element portion 241 may have a multiple-quantum well structure.

The second cladding layer 216 and 28 of the first laser element portion may have a p-type conduction type and its p-type carrier density is preferably not larger than $8 \times 10^{17}$ cm$^{-3}$.

When the average value of the fist wavelength and the second wavelength is $\lambda$, a dielectric film of a semiconductor film with the thickness of $\lambda/2$ or $\lambda/4$ may be formed on facets of the first laser element portion and facets of the second laser element portion, respectively.

The above-described features can be realized by the best use of the latest MOCVD technology and microprocessing technology. It is particularly important to increase the temperature controllability during crystal growth and to accurately control gas flows.

Explained below is such an integrated laser array according to an embodiment of the invention in detail, comparing with a comparative examples.

FIG. 9 is a cross-sectional view showing construction of a semiconductor laser array for two beams of oscillation wavelengths of 780 nm and 650 nm, taken as an example of the invention. In FIG. 9, 240 denotes a laser element portion for the oscillation wavelength 780 nm, and 241 is a laser element portion for the oscillation wavelength 650 nm. Their construction is roughly explained below.

In each of the laser element portions 240, 241, sequentially stacked on a substrate 210 are an n-GaAs buffer layer 211 (221), n-$In_{0.5}(Ga_{0.3}Al_{0.7})_{0.5}P$ first cladding layer 212 (222), $In_{0.5}(Ga_{0.5}Al_{0.5})_{0.5}P$ optical guide layer 213 (223), multiple quantum well (MQW) active layer 214 (224), $In_{0.5}(Ga_{0.5}Al_{0.5})_{0.5}P$ optical guide layer 215 (225), p-$In_{0.5}(Ga_{0.3}Al_{0.7})_{0.5}P$ second cladding layer 216 (226), p-$In_{0.5}Ga_{0.5}P$ etching stop layer 217 (227), p-$In_{0.5}(Ga_{0.3}Al_{0.7})_{0.5}P$ third cladding layer 218 (228), p-$In_{0.5}Ga_{0.5}P$ cap layer 219 (229), n-GaAs current-blocking layer 231 and p-GaAs buried layer 232. The current-blocking layer 231 blocks and concentrates the electrical current into the stripe region of the element. The current-blocking layer 231 also confines the light emitted from the active layer 214 (224) in the lateral direction to control transverse modes.

In the laser element portion 240 for the wavelength 780 nm, the active layer 214 has a bulk structure of a GaAlAs layer. Alternatively, the active layer 214 may have a MQW structure of $Ga_{0.9}Al_{0.1}As$ well layers and $Ga_{0.65}Al_{0.35}As$ barrier layers.

In the laser element portion 241 for the wavelength 650 nm, the active layer 224 has a MQW structure of $In_{0.5}Ga_{0.5}As$ well layers and $In_{0.5}(Ga_{0.5}Al_{0.5})_{0.5}P$ barrier layers.

In the structure shown in FIG. 9, the third cladding layers 218, 228 processed into convex stripes and the GaAs current-blocking layer 231 are combined to form refractive index steps in the transverse direction, and both lasers 240, 241 are realized as index-guided lasers. The GaAs current-blocking layer 231 also functions to confine electric currents to respective ridge stripe portions. Both these element portions are electrically isolated by a separation groove 236 to be driven independently via electrodes 233, 234. A minus-side electrode 235 can be made on the bottom surface of the substrate 210 to be used commonly. As explained before, the laser element portion 240 can be used for CD discs, and the laser element portion 241 can be used for DVD disks. That is, they are suitable for use as LD of the optical integrated units explained above.

Additionally, the laser array shown in FIG. 9 has a unique structure in employing the GaAlAs compound active layer with respect to the InGaAlP compound cladding layers. By combining unique mixed crystals in this manner, two kinds of elements having different laser wavelengths of the visible region (650 nm) and the infrared region (780 nm) can be integrated.

The laser array according to the invention is particularly advantageous in having an excellent heat radiating property and being manufactured reliably. These advantages of the laser array according to the invention are explained below, comparing with a semiconductor laser array by a related technique tried in the course toward the unique structure according to the invention.

Figure 28A:
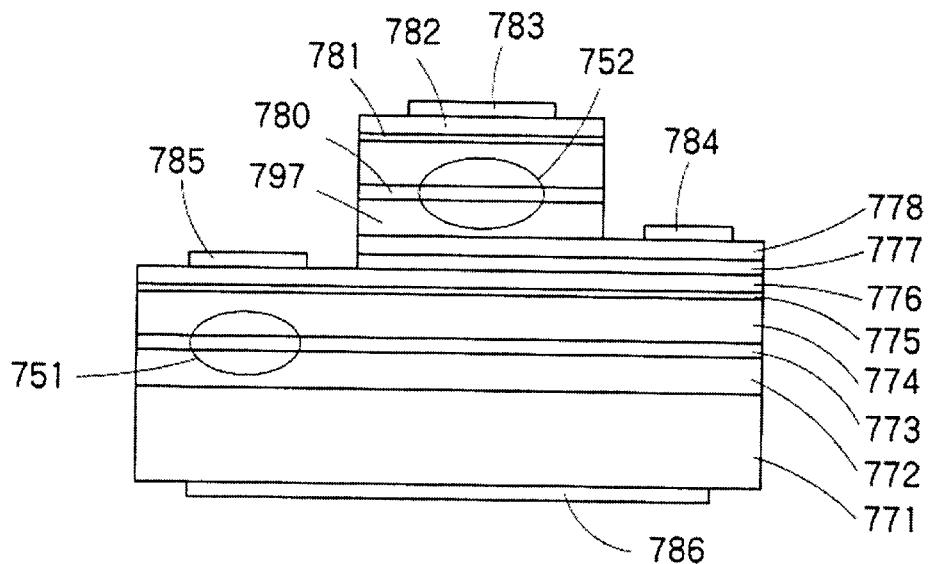
FIGS. 28A and 28B are schematic cross-sectional views of a 2-beam laser array as a comparative example.

FIG. 28A is a schematic cross-sectional view of a 2-beam laser array as a comparative example. In FIG. 28A, 751 denotes a laser oscillating portion of the wavelength 780 nm, and 752 is a laser oscillating portion of the wavelength 650 nm. That is, the laser array has a structure in which a double-heterostructure for generating two different kinds of laser beams is stacked, and processed and separated into the form of steps. Electrodes are obtained through p contact layers 785, 783 and n contact layers 786, 784 to drive two lasers independently. Only the double-heterostructure in contact with the substrate can take one of electrodes from the substrate. The 2-beam laser array can be made of an epitaxial substrate stacking two double-heterostructures shown in FIG. 28B. That is, after the p contact layers 776, 782 and n contact layer 778 of the double-heterostructure is exposed in each portion by using known lithography and etching, electrodes are made. Although this example is of a 2-beam type, any desired number of multi-beam laser can be made theoretically by additionally stacking one or more double-heterostructures and repeating lithography and etching.

Figure 28B:
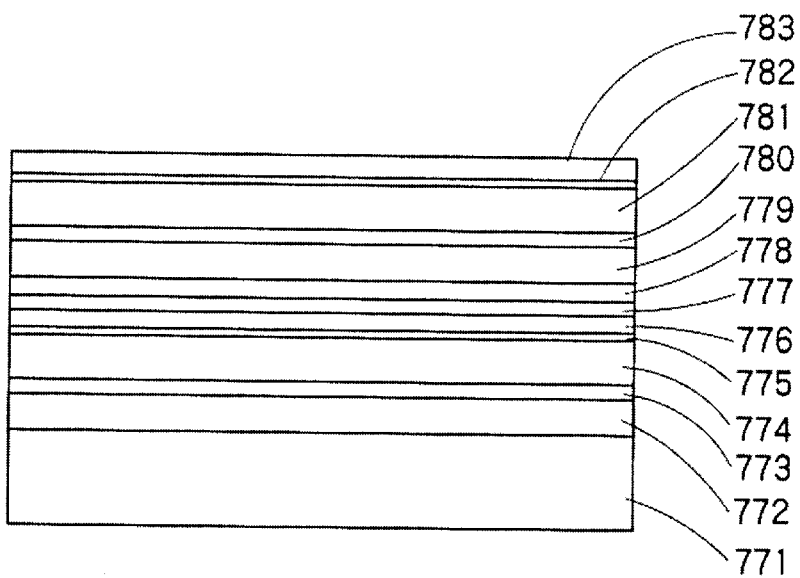
Figure 29:
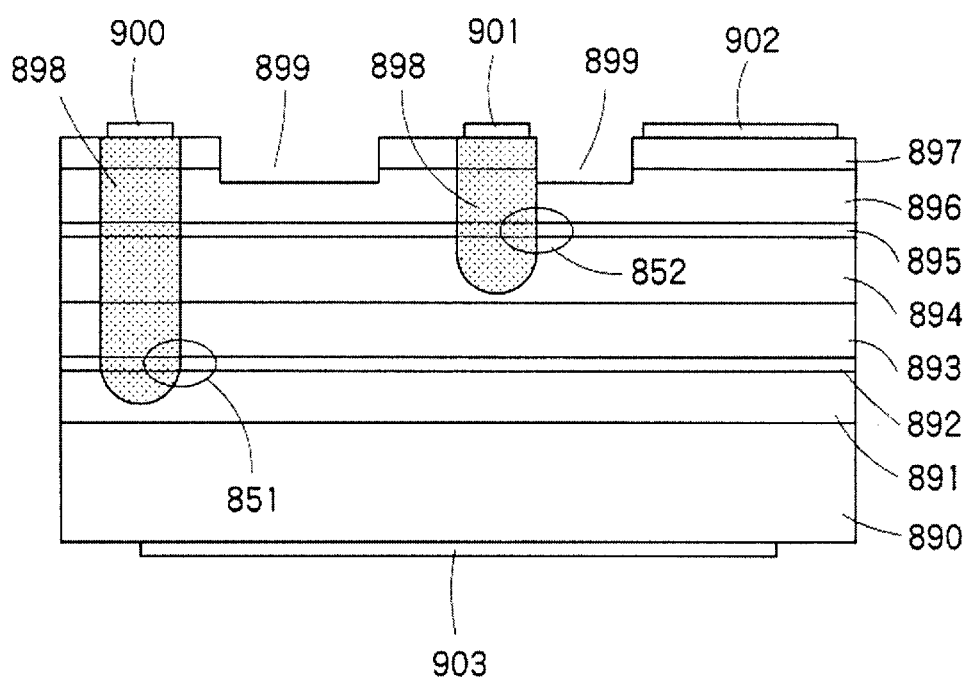
FIG. 29 is a schematic cross-sectional view of a 2-beam laser array as an another comparative example.

On the other hand, FIG. 29 is a schematic cross-sectional view of a 2-beam laser array as an another comparative example. In FIG. 29, 851 denotes a laser oscillating portion of the wavelength 780 nm and 852 is a laser oscillating portion of the wavelength 650 nm. Similarly to the construction shown in FIGS. 28A and 28B, here are used two epitaxial growth layers forming a multi-layered double-heterostructure for generating two different laser beams. In this example, however, all of the growth layers are p-type layers, and an n-type selective diffusion region 898 is made after their crystal growth to form a desired pn junction and ohmic contact.

The laser arrays by these related arts involved problems explained below. First, if is difficult for each integrated laser element portion to have beam properties suitable for optical disk light sources. When a semiconductor laser is used in an optical disk system, it is required to have a single horizontal transverse mode in beams therefrom and an astigmatism not larger than 10 μm approximately. However, laser elements in the semiconductor laser arrays shown in FIGS. 28A, 28B and 29 are so-called "gain-guided" lasers merely controlled in current injection, and do not satisfy the requirements. To meet these requirements, there is a method of making steps of refractive index in the transverse direction of the laser stripe to form a so-called index-guided structure. It is not essentially impossible to build refractive index steps in each laser element portion in the semiconductor laser array shown in FIGS. 28A and 28B.

However, because the multi-layered double-heterostructure must be processed into the form of steps, a large step is inevitably made along the surface, and it makes lithography very difficult. Moreover, since a difference in composition and size in each double-heterostructure compels to take different processes for making refractive index steps in each portion, a large number of lithographic steps are required. For these reasons, it was difficult to fabricate the laser array having index-guided laser element portions with an acceptable production yield.

Another problem is a difficulty in mounting laser array chips. To ensure stable operation of the laser over a long term, heat generated upon laser operation must be discharged efficiently. For this purpose, usually used is a so-called "upside-down" mounting method in which the side nearer to the epitaxial layers is welded to a heat sink. However, the semiconductor laser array shown in FIGS. 28A and 28B inevitably has formed a large step on the top surface, and it made it difficult to weld the chip while ensuring good heat radiation from all laser element portions forming the array. Additionally, as explained above, there is the restriction that most of electrodes must be made on the side of the epitaxial layers, and many electrode patterns must be made also on the heat sink. Thus, structure of the heat sink was complicated, and it was very difficult to weld the chip with no short circuit in any of the patterns and with an acceptable yield.

These problems become more and more serious as the number of beams increases. The semiconductor laser array shown in FIG. 29 also involves the same problems. Unlike the semiconductor laser array shown in FIGS. 28A and 28B, it has no large step on the surface, and it can be mounted more easily. However, when it is mounted upside-down, the distance from the heat sink increases as the laser element portion is nearer to the substrate side, and heat radiation therefrom degrades. Additionally, it needs a technique for diffusing silicon to different depths, and therefore complicates the process and decreases the production yield.

As explained above, the semiconductor laser arrays according to the related art shown in FIGS. 28A, 28B and 29 are difficult to mount and low in production yield due to their complex manufacturing process. Therefore, it was very difficult to practically use them as light sources of optical disk systems.

In contrast, according to the invention, the laser array has a sufficiently flat surface, and can be mounted upside down reliably and easily. Therefore, it satisfies the temperature characteristics required particularly in optical disk systems. Additionally, any of integrated laser element portions are sufficiently near the heat sink when the array is mounted upside down, and heat can be radiated evenly.

Moreover, the electrode pattern on the laser array is simple, and removes the problem of short-circuit between electrodes. Furthermore, since the laser array according to the invention has a unique feature in its manufacturing process as explained later in greater detail, it is advantageous in ensuring easy and reliable realization of a multi-beam laser.

Next explained is a manufacturing method of a laser array according to the invention.

FIGS. 10 through 18 are cross-sectional views showing different steps of a manufacturing method of a semiconductor laser array according to the invention. First as shown in FIG. 10, grown on an n-type (n-)GaAs substrate 210 are a series of epitaxial layers 211 through 220 according to the specification for a 780 nm laser by MOCVD (metal-organic chemical vapor deposition). An AlGaAs compound multi-quantum well structure may be made as the active layer 214. Carrier concentration of the p-type (p-) cladding layer is preferably limited lower than approximately $8\times10^{17}$ (cm$^{-3}$) to prevent undesirable dispersion of the p-type dopant into adjacent layers.

Next as shown in FIG. 11, the grown layers are removed selectively. For this process, photolithography and etching may be combined appropriately.

Next as shown in FIG. 12, another crystal growth is made. More specifically, a series of epitaxial layers 221 through 229 according to the specification for a 650 nm laser are grown by MOCVD. An InGaP/InGaAlP multi-quantum well structure may be used as the active layer 224. By appropriately selecting a primary treatment and conditions for crystal growth, epitaxial layers of a quality equivalent to that obtained by growth on a flat substrate surface can be obtained. As a result of an experiment by the Inventor, it has been confirmed that this crystal growth does not adversely affect the epitaxial layers previously made according to the specification for the 780 nm laser.

Next as shown in FIG. 13, the layers grown with the specification for the 650 nm laser are selectively removed. For this process, photolithography and etching may be combined. during the process, the epitaxial layers 211 through 219 with the 780 nm specification are protected by the n-GaAs layer 220. After that, the n-GaAs layer 220 may be removed selectively. Through these steps, the 780 nm laser region and the 650 nm laser region can be made in different regions on a common substrate.

Next s shown in FIG. 14, ridge stripes are made. More specifically, A SiO$_2$ stripe mask 230 is formed on each laser element portion, and cap layer 219, 229 and third cladding layers 218, 228 are removed simultaneously by wet etching. Etching can be stopped at the etching stop layers 217, 227.

The cap layers 219, 229 and the third cladding layers 218, 228 are preferably designed previously to be equal in thickness in all laser element portions to ensure that etching progresses to the etching stop layers in substantially the same time in all element portions because the etching stop layers 219, 229 are also etched gradually, and etching may progress beyond the etching stop layer in any of the element portions if the etching time largely varies among respective element portions. As explained later, since the laser property of each element portion does not largely depends on the third cladding layer, it is easy to design them equally.

Next as shown in FIG. 15, the GaAs current-blocking layer 231 is grown. More specifically, it is made by selective growth using MOCVD. In this process, growth conditions can be adjusted to prevent crystal growth on the SiO$_2$ mask 230.

Next as shown in FIG. 16, a buried layer 232 is grown. More specifically, after the SiO$_2$ stripe mask 230 is removed, the buried layer is grown by MOCVD.

Next as shown in FIG. 17, the separation groove 236 is made. More specifically, selective etching is conducted by using RIE (reactive ion etching). Usable as the reactive gas is a mixed gas of Cl$_2$ and BCl$_3$, for example.

Next as shown in FIG. 18, electrodes are made. More specifically, using a lift-off process, for example, independent electrodes 233, 234 are made in respective laser element portions, followed by abrasion of substrate 210 from its bottom surface to adjust its thickness to approximately 100 μm, thereby to form the common electrode 235. After that, the electrode is alloyed in a nitrogen atmosphere at 430° C. approximately. The order of process for making the separation groove 236 and the process for making the p-electrode 233, 234 may be changed.

The wafer prepared in this manner is cleaved along the direction perpendicular to the stripes to divide it into bars with the width of 400 μm. A cleaved surfaces of each bar functions as a reflective mirror of the laser. To protect the facets, an Al$_2$O$_3$ film was applied onto both cleaved surfaces by sputtering. Its thickness may be chosen to a half the mean optical wavelength of 650 nm and 780 nm. Then, the facet reflectance is calculated as 29.4% for laser light of the wavelength 650 nm and 28.8% for laser light of 780 nm. In a design with a half the individual optical wavelength, the facet reflectance is approximately 30 to 32%. Even when comparing with this, the above-indicated values of reflectance are in a practically acceptable level. Therefore, the Al$_2$O$_3$ facet protective film can be commonly used for two laser elements.

In order to ensure a higher optical output, a high-reflective film is typically applied onto a facet opposite from the emission facet. This is attained by stacking multiple layers of dielectric films or semiconductor films with a thickness equal to the ¼ or 0~½ optical length of the above-indicated average wavelength to make a Bragg reflector. Usable as the dielectric films are, for example, Al$_2$O$_3$, SiO$_x$, TiO$_2$ and SiN$_x$. Amorphous silicon is usable as the semiconductor film. In an example with layers of Al$_2$O$_3$ (θ/4 optical length)/SiN$_x$ (θ/4 optical length)/SiO$_x$ (θ/4 optical length)/SiN$_x$ (θ/4 optical length)/SiO$_x$ (θ/4 optical length)/SiN$_x$ (θ/4 optical length)/SiO$_x$ (θ/2 optical length) where θ is the average wavelength, facet reflectance is approximately 66% for the wavelength 780 nm and approximately 70% for the wavelength 650 nm.

Each bar is divided into chips, and each chip is mounted on a heat sink.

Figure 19:
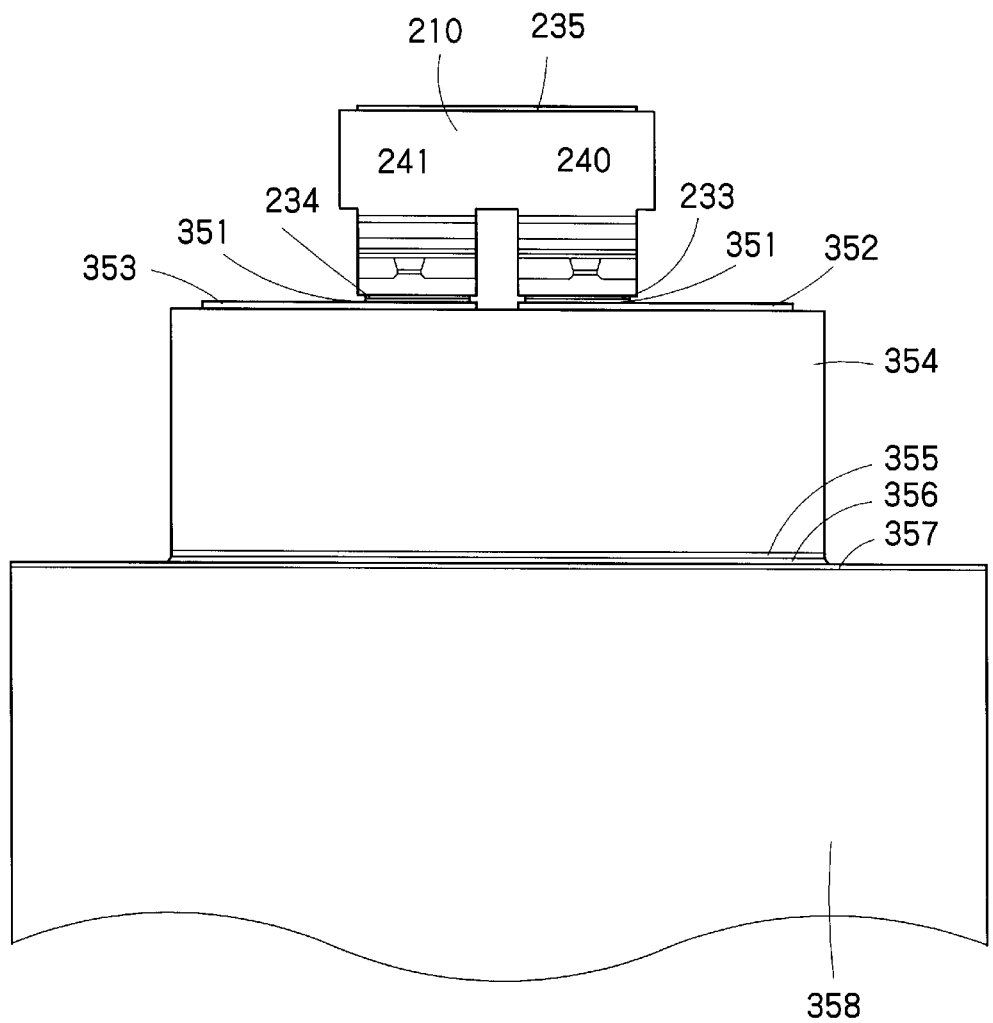
FIG. 19 is a diagram schematically showing the mounted aspect of the semiconductor laser array according to the invention.

FIG. 19 is a schematic diagram showing a mounted aspect of the semiconductor laser array according to the invention. This example shown here corresponds to the mode of mounting shown in FIG. 6. That is, the laser element is mounted on a Cu heat sink 41 via an insulating AlN sub-mount 50. The sub-mount 50 has formed a pattern of gold electrode pads 352, 353, and they are connected to p-electrodes 233, 234 of the respective laser element portions by gold-tin solder 351. For this mode of mounting on patterned electrodes, a conventional pattern recognition technique can be used. Additionally, a gold electrode 355 is formed on the bottom surface of the sub-mount 50, and it is connected to a gold electrode 357 formed on the surface of the heat sink 41 by gold-tin solder 356.

The manufacturing method according to the invention is unique in first growing the multi-layered structure for the 780 nm laser element portion 240 and next growing the multi-layered structure for the 650 nm laser element portion 241. By growing layers in this order, two kinds of laser structures can be integrated without deteriorating the semiconductor layers grown first because the 780 nm laser element portion is less subject to deterioration by heat.

In laser elements, in general, there is the problem that the light emitting property degrades particularly when the dopant diffuses from the p-type cladding layer to the active layer. To prevent it, impurity concentration of the p-type cladding layer must be as low as possible. Comparing the 780 nm laser with the 650 nm laser, since the band gap of the active layer is narrower in the 780 nm laser, the band gap difference from that of the cladding layer can be made larger in the 780 nm laser. As a result, carrier concentration of its p-type cladding layer can be decreased.

On the other hand, in the 650 nm laser, the band gap difference between the active layer and the cladding layer is small, the p-type cladding layer needs doping of the p-type impurity with a relatively high concentration.

For these reasons, by first growing the 780 nm laser element portion, a plurality of laser structures can be integrated while minimizing deterioration of the element caused by diffusion of the p-type impurity.

The manufacturing method according to the invention is also unique in limiting the doping concentration of the p-cladding layer in the 780 nm laser element portion 240 first grown to approximately $3 \times 10^{17}$ (cm$^{-3}$). As explained before, in the 780 nm laser, concentration of the p-cladding layer can be held in this level of concentration. As a result, unintentional diffusion of the p-type dopant into adjacent layers can be prevented, and it is therefore possible to remove the problem that the p-type dopant diffuses into the active layer 224 of the laser element portion 240 and deteriorated the light emission property when the laser element portion 240 is heated during growth of the laser element portion 241.

Additionally, according to the invention, since the epitaxial layers in the laser element portions 240, 241 are almost equal in thickness, no step is produced, and good contact to the sub-mount 50 is ensured.

Furthermore, according to the invention, since both the laser element portions 240 and 241 are mounted on the sub-mount 50 only through the cap layer and the p-side electrode, good heat radiation is ensured. Through measurement of heat resistance of both element portions by using a ΔmV voltmeter, it has been confirmed that it is approximately 30° C./W up to the AlN sub-mount 50, and it is equivalent to heat resistance of a single laser element.

FIGS. 20A and 20B are graphs showing current-optical output characteristics and oscillation spectrums of the 780 nm laser element portion in the semiconductor laser array according to the invention.

FIGS. 21A and 21B are graphs showing current-optical output characteristics and oscillation spectrums of the 650 nm laser element portion in the semiconductor laser array according to the invention.

As these graphs show, current-optical output characteristics equivalent to those of an independent laser element are obtained in both the 780 nm laser element portion and the 650 nm laser element portion. The transverse mode exhibits a single peak in both of them. Astigmatism was measured by a knife-edge method, and it was confirmed to be as good as 4 to 5 μm in both of them. Oscillation spectrum was a single mode under 5 mW in both of them. These properties can be adjusted by changing their double-heterostructure. An example thereof is shown below.

FIGS. 22A through 23B are graphs showing current-optical output characteristics and oscillation spectrums of a 2-beam laser array for oscillation wavelengths 780 nm and 650 nm, taken as another example of the invention. Construction of the laser array is essentially the same as that shown in FIG. 9, but the second cladding layer 216 of, the 780 nm laser element is slightly thicker. In this manner, the laser can be made available for multi-mode oscillation spectrums, and noise of the laser can be reduced when used with optical discs. Although a single mode laser usually requires high-frequency superposition to reduce noise in application with optical disks, the example shown here removes the requirement. Although the threshold current value of the laser slightly increases, it is not serious. In contrast, in the construction of FIG. 9, both the third cladding layers 218, 228 are equal in thickness, etching for making the convex stripes can be conducted simultaneously in both laser element portions.

Figure 24A:
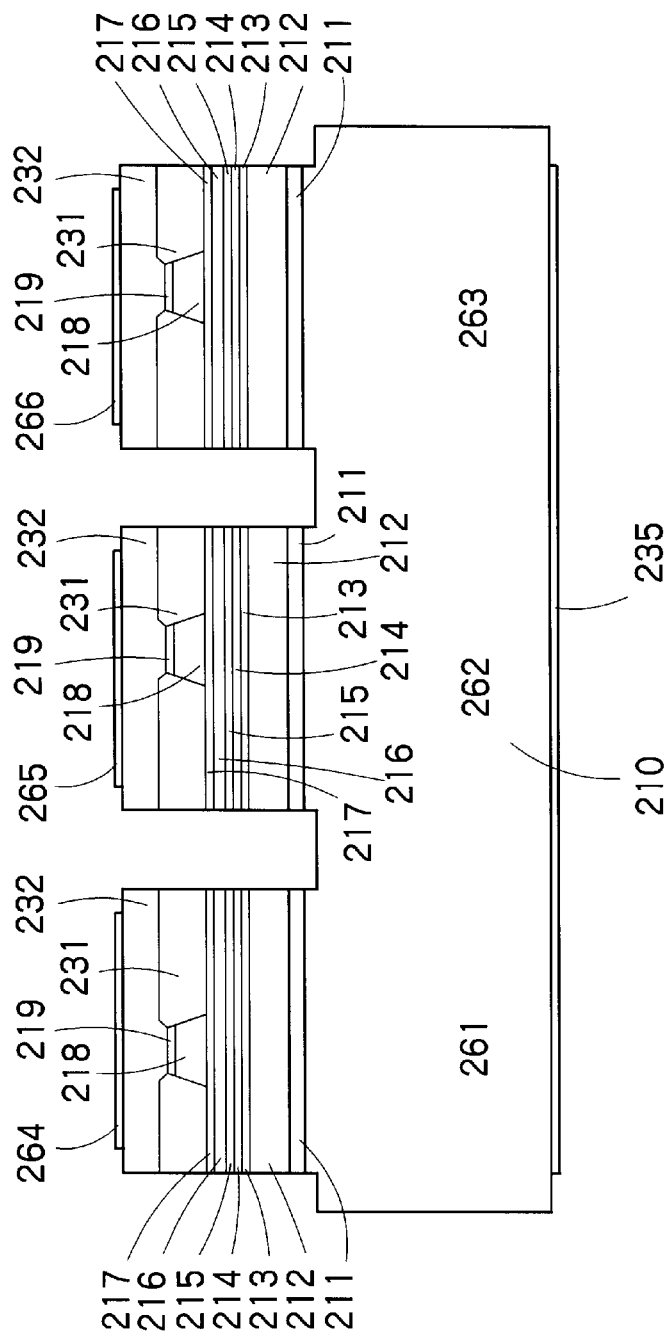

FIGS. 24A through 24D are cross-sectional views showing construction of other examples of the invention. As to laser arrays shown here, the same portion as those of the foregoing example are labeled with common reference numerals, and their detailed explanation is omitted FIG. 24A is a cross-sectional view showing construction of a 3-beam laser array for 780 nm TE mode, 650 nm TE mode and 650 nm TM mode, taken as another example of the invention. The 780 nm TE mode laser element portion 261, 650 nm TE mode laser element portion 262 have the same double-heterostructure as that of FIG. 9. The 650 nm TM mode laser element portion 263 can be made by introducing a tensile stress into the InGaP quantum well layer of the active layer.

FIG. 24B is a cross-sectional view showing construction of a 2-beam semiconductor laser array for oscillation wavelengths of 780 nm and 650 nm, for example. In the laser array shown in FIG. 24B, the cladding layers 212, 216, 222 and 226 may be formed of InGaAlP. Alternatively, the cladding layers 212 and 216 may be formed of AlGaAs while the cladding layers 222 and 226 may be formed of InGaAlP.

n-GaAs current-blocking layer 231 is selectively stacked on the p-GaAs cap layer 219 and p-In$_{0.5}$Ga$_{0.5}$P cap layer 229. The cap layer 219 may alternatively formed of p-InGaP. The current-blocking layer 231 has an stripe-shaped opening through which the electrical current is injected into the lasing portion 250 (251). The laser array shown in FIG. 24B has the same feature and advantages as the laser array shown in FIG. 9.

FIG. 24C is a cross-sectional view showing construction of another 2-beam semiconductor laser array for oscillation wavelengths according to the invention. In this laser array, the cladding layers 212, 216, 222 and 226 may be formed of InGaAlP. Alternatively, the cladding layers 212 and 216 may be formed of AlGaAs while the cladding layers 222 and 226 may be formed of InGaAlP.

p-GaAs buried layers 232 are selectively stacked on the p-GaAs cap layer 219 and p-In$_{0.5}$Ga$_{0.5}$P cap layer 229. The cap layer 219 may alternatively formed of p-InGaP. In FIG. 24C, the spotted portions correspond to the current-blocking layer 231 having a high electrical resistivity. The high resistive current-blocking layer 231 may be formed by selectively introducing a impurity such as proton. Ion implantation technique may be employed in order to form the current-blocking layer 231. The stripe-shaped region between the current-blocking layer 231 remains to be conductive, so that the electrical current may be injected into the lasing portion 250 (251). The laser array shown in FIG. 24B also have the same feature and advantages as the laser array shown in FIG. 9.

FIG. 24D is a cross-sectional view showing construction of another 2-beam semiconductor laser array for oscillation wavelengths according to the invention. In this laser array, the cladding layers 212, 216, 222 and 226 may be formed of InGaAlP. The p-InGaP etching stop layers 217 and 227 are interposed in the cladding layers 216 and 226. The upper portions of the cladding layers 216 and 226 are formed to be the stripe-shaped ridge waveguides. On the top of the ridge, the intermediate layer 260 is formed. The top layer 261 may be formed of p-GaAs. The layer 260 is formed of a semiconductor material having an intermediate bandgap between cladding layer 216 (226) and the top layer 261. N-InGaP may be used for the layer 260.

Since the interface between the p-InGaAlP cladding layer 216 (226) and n-GaAs top layer 260 has a large heterobarrier spike, the electrical current is blocked. In this sense, the top layer 260 can function as the current-blocking layer at the both sides of the ridge. In contrast to this, on the stripe-shaped cladding layer 216 and 226, the intermediate layer 260 makes the hetero-barrier spike much lower. As a result, the electrical current is effectively concentrated into the stripe-shaped region. The laser array shown in FIG. 24D also have the same feature and advantages as the laser array shown in FIG. 9.

FIG. 24E is a cross-sectional view showing construction of another 2-beam semiconductor laser array for oscillation wavelengths according to the invention. In this laser array, the cladding layers 212, 216, 222 and 226 may be formed of InGaAlP. On the top of the cladding layers 216 and 226, the stripe-shaped intermediate layers 260, 260 are formed. The top layer 261 may be formed of p-GaAs. The layer 260 is formed of a semiconductor material having an intermediate bandgap between cladding layer 216 (226) and the top layer 261. N-InGaP may be used for the layer 260.

Since the interface between the p-InGaAlP cladding layer 216 (226) and n-GaAs top layer 260 has a large heterobarrier spike, the electrical current is blocked. In this sense, the top layer 260 can function as the current-blocking layer at the both sides of the stripe. In contrast to this, the stripe-shaped intermediate layer 260 makes the heterobarrier spike much lower. As a result, the electrical current is effectively concentrated into the stripe-shaped region. The laser array shown in FIG. 24E also have the same feature and advantages as the laser array shown in FIG. 9.

Next explained is an optical disk driving apparatus according to the invention.

FIG. 25 is a block diagram of the optical disk driving apparatus according to the invention. The present invention enables realization of a compact, light optical disk driving apparatus compatible with DVD disks and CDs, for example, by using an optical integrated unit or an optical pickup as explained with reference to FIGS. 1 through 8.

The apparatus shown in FIG. 25 is an optical disk driving apparatus capable of driving DVD-ROM disks and CDs, and includes a signal processing system for DVDs and another signal processing system for CDs.

A DVD or CD optical disk (DSC) is rotated at a predetermined revolution by a driver (DR). The optical pickup (PU) moves to a predetermined position under a servo control (SV). The optical pickup may be any of those explained with reference to FIGS. 1 through 8. One of semiconductor laser arrays explained with reference to FIGS. 9 through 24 is preferably used as the light of the optical pickup.

Signals recorded on a disk are detected by the optical pickup. In this process, the optical pickup adequately determines whether the disk is DVD or CD, and used light from a predetermined light source.

Detected signals are supplied to the DVD signal processing system or the CD signal processing system, depending upon whether the signals come from DVD or CD.

First explained is the DVD signal processing system. Signals detected by the optical pickup are demodulated in accordance with the decoding standards, and error correction is added (ENC/ERR). Then, after buffering (BU), the signals are sent to an MPEG2 video/audio processor for separating them into video and audio signals and executing processes up to demodulation of MPEG2 video demodulation algorithm (MPEG-2 V/DEC) and audio (AC-3 or MPEG) demodulation (A/DEC). Then, images are encoded by NTSC/PAL and output (NTSC/PAL ENC). Audio signals are output through a D/A converter (D/A). Since video signals are output at a variable rate, buffer memory functions to absorb it. The entire system is controlled by CPU for system control, and it is established as a total system including a servo system as well.

As to the CD signal processing system, signals are decoded (DEC), demodulated, then delivered through shock-proof memory (SHC/MEM) to a D/A converter for conversion into an analog form, and then output as audio signals. Simultaneously, sub-codes of the detected signals are output from a CD-G (CD-graphic) processor (CD-G PRC) as video signals.

The servo system is common to DVD and CD, and the entirety of the system is controlled by CPU. Part of the signal processing system can be commonly used appropriately.

According to the invention, there is provided an optical disk driving apparatus which is compatible to both DVDs and CDs, for example, compact and light, and highly reliable against mechanical shocks or vibrations or changes in the ambient temperature.

The invention is embodied in the above-explained modes, and attains the following effects.

According to the invention, a semiconductor laser array integrating index-guided semiconductor lasers different in oscillation wavelength can be provided. Particularly, processes such as lithography, etc. can be reduced because double transverse mode control, current-blocking and burying processes of respective elements are conducted collectively.

The semiconductor laser array according to the invention has almost no step on the surface of the elements, and therefore facilitates the lithographic process. The flat surface of the elements makes welding to the heat sink easy, and improves heat radiation.

Further, with the semiconductor laser array according to the invention, electric wiring is easy because one of electrodes of each laser element can be made on the substrate side.

As set forth above, according to the invention, a plurality of index-guided lasers different in oscillation wavelength and polarizing mode can be integrated on a single chip in a simple process with a good production yield. As a result, construction of the pickup in the optical disk system can be simplified.

Additionally, according to the invention, by equalizing the second cladding layers of respective laser element portions in thickness and by using an etching stop layer, etching for making convex stripe waveguides can be effected reliably under good control.

Moreover, according to the invention, by combining the AlGaAs active layer with the InGaAlP cladding layer, a laser array incorporating a visible region and an infrared region can be realized.

According to the invention, by adequately determining oscillation wavelengths of respective laser element portion in the semiconductor laser array, a semiconductor laser array for an optical disk system compatible with both the CD standards and the DVD standards can be realized.

When comparing the optical pickup according to the invention with the conventional structure shown in FIG. 26, because a unified optical integrated unit is used, it is apparent that the optical system is largely simplified.

On the other hand, according to the invention, an optical integrated unit capable of releasing light beams with a plurality of wavelengths and detecting their return light can be provided. By using such an optical integrated unit, an optical pickup significantly reduced in number of parts and significantly simplified in its optical system can be realized.

Furthermore, according to the invention, optical axes of different wavelengths of the optical pickup lie on a common axis, and adjustment of the optical axis may be once. Further, two-wavelength multiplexing means such as dichroic prism need not be used. The number of parts such as laser element, photodetector element, hologram element and stem may be singular, respectively.

That is, according to the invention, an optical disk driving apparatus much more compact, light and reliable against mechanical vibrations or shocks than conventional ones can be realized, and its industrial merits are great.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No.H10-181068 filed on Jun. 26, 1998 including specification, claims, drawings and summary is incorporated herein by reference in its entirety.

What is claimed is:

1. An optical integrated unit comprising:
   an integrated laser array including a first laser element portion and a second laser element portion integrated side by side on a common substrate, said first laser element portion releasing laser light of a first wavelength, and said second laser element portion releasing light of a second wavelength different from said first wavelength in a direction substantially parallel to the laser light of said first wavelength; and
   a detector configured to detect first reflected return light which is part of the laser light of said first wavelength and second reflected return light which is part of the laser light of said second wavelength, said detector being placed sideward of the integrated laser array so that a plane which includes axes of the laser lights released from the first and second laser element portions intersects the detector;
   wherein the detector is configured to receive and detect the first reflected return light and the second reflected return light at a common location within the detector.

2. The optical integrated unit according to claim 1 further comprising a holographic optical element configured to diffract said first return light by a first diffraction angle and said second return light by a second diffraction angle different from said first diffraction angle.

3. The optical integrated unit according to claim 2, wherein the common detecting position is substantially in a common plane which includes the laser light of the first wavelength and the laser light of the second wavelength.

4. The optical integrated unit according to claim 1 wherein said laser array has a GaAs substrate, said first and second laser element portions being provided on said substrate,
   said first laser element portion including a first cladding layer, an active layer formed by epitaxial growth on said first cladding layer, a second cladding layer formed on said active layer, and a current-blocking layer to confine an electrical current injected into said first laser element portion,
   said second laser element portion including a first cladding layer, an active layer formed by epitaxially growing a second semiconductor material on said first cladding layer, a second cladding layer formed on said active layer, and a current-blocking layer, and
   wherein said current-blocking layer of said first laser element portion and said current-blocking layer of said second laser element portion are made of the same semiconductor material.

5. The optical integrated unit according to claim 4, wherein the active layer of the first laser element portion and the active layer of the second laser element portion are substantially at the same level from the common substrate.

6. The optical integrated unit according to claim 1 wherein said laser array has a GaAs substrate, said first and second laser element portions being provided on said substrate,
   said first laser element portion including a first cladding layer made of GaAlP, an active layer formed on said first cladding layer, a second cladding layer formed on said active layer and made of InGaAlP, a stripe-shaped intermediate layer formed on said second cladding layer and made of a semiconductor material having a smaller band gap than said second cladding layer, and a top layer formed over said second cladding layer and said intermediate layer and made of a semiconductor material having a smaller band gap than said intermediate layer,
   said second laser element portion including a first cladding layer made of InGaAlP, an active layer formed on said first cladding layer, a second cladding layer formed on said active layer and made of InGaAlP, a stripe-shaped intermediate layer formed on said second cladding layer and made of a semiconductor material having a smaller band gap than said second cladding layer, and a top layer formed over said second cladding layer and said intermediate layer and made of a semiconductor material having a smaller band gap than said intermediate layer.

7. The optical integrated unit according to claim 6, wherein the active layer of the first laser element portion and the active layer of the second laser element portion are substantially at the same level from the common substrate.

8. The optical integrated unit according to claim 1 wherein said first wavelength ranges about 780 nm as its peak, and said second wavelength ranges about one of 635 nm, 650 nm, and 685 nm as its peak.

9. The optical integrated unit according to claim 1, wherein the laser lights of the first and second wavelengths are released from substantially the same level from the common substrate.

10. An optical pickup comprising:
    an optical integrated unit including an integrated laser array and a detector, said integrated laser array including a first laser element portion and a second laser element portion integrated side by side on a common substrate, said first laser element portion releasing laser light of a first wavelength, said second laser element portion releasing laser light of a second wavelength different from said first wavelength in a direction substantially parallel to the laser light of said first wavelength, said detector detecting first reflected return light which is part of the laser light of said first wavelength and second reflected return light which is part of the laser light of said second wavelength, said detector being placed sideward of the integrated laser array so that a plane which includes axes of the laser lights released from the first and second laser element portions intersects the detector; and a holographic optical element to diffract said first return light by a first diffraction angle and said second return light by a second diffraction angle different from said first diffraction angle;

wherein the holographic optical element diffracts the first and second reflected return lights onto a common location within the detector.

11. The optical integrated unit according to claim 10, wherein axes of the laser lights released from the first and second laser element portions and axes of the diffracted lights from the holographic optical element are substantially in a common plane.

12. An optical pickup comprising:

an optical integrated unit including an integrated laser array and a detector, said integrated laser array including a first laser element portion and a second laser element portion integrated side by side on a common substrate, said first laser element portion releasing laser light of a first wavelength, said second laser element portion releasing laser light of a second wavelength different from said first wavelength in a direction substantially parallel to the laser light of said first wavelength, said detector detecting first reflected return light which is part of the laser light of said first wavelength and second reflected return light which is part of the laser light of said second wavelength, said detector being placed sideward of the integrated laser array so that a plane which includes axes of the laser lights released from the first and second laser element portions intersects the detector; and an optical system configured to receive said laser light of a first wavelength and said laser light of a second wavelength and direct it onto an optical disk, and to guide light reflected back from said optical disk to said optical integrated unit;

wherein the detector is configured to receive and detect the first reflected return light and the second reflected return light at a common location within the detector.

13. An optical integrated unit comprising:

an integrated laser array including a first laser element portion and a second laser element portion integrated side by side on a common substrate, said first laser element portion releasing laser light of a first wavelength, and said second laser element portion releasing light of a second wavelength different from said first wavelength in a direction substantially parallel to the laser light of said first wavelength; and a detector configured to detect first reflected return light which is part of the laser light of said first wavelength and second reflected return light which is part of the laser light of said second wavelength;

wherein the detector is configured to receive and detect the first reflected return light and the second reflected return light at a common location within the detector.

14. The optical integrated unit according to claim 13, and further comprising a holographic optical element configured to diffract said first return light by a first diffraction angle and said second return light by a second diffraction angle different from said first diffraction angle.

* * * * *